United States Patent
Sakamoto et al.

(10) Patent No.: US 6,656,540 B2
(45) Date of Patent: Dec. 2, 2003

(54) METHOD FOR FORMING METALLIC FILM AND APPARATUS FOR FORMING THE SAME

(75) Inventors: Hitoshi Sakamoto, Takasago (JP); Toshihiko Nishimori, Yokohama (JP); Saneyuki Goya, Yokohama (JP); Takao Abe, Yokohama (JP); Noriaki Ueda, Kobe (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 81 days.

(21) Appl. No.: 09/926,624

(22) PCT Filed: May 26, 2001

(86) PCT No.: PCT/JP01/02392
§ 371 (c)(1),
(2), (4) Date: Nov. 27, 2001

(87) PCT Pub. No.: WO01/73159
PCT Pub. Date: Oct. 4, 2001

(65) Prior Publication Data
US 2002/0142572 A1 Oct. 3, 2002

(30) Foreign Application Priority Data

Mar. 27, 2000 (JP) ........................... 085511-2000
Apr. 10, 2000 (JP) ........................... 108120-2000
May 31, 2000 (JP) ........................... 161507-2000
Oct. 20, 2000 (JP) ........................... 320136-2000

(51) Int. Cl.[7] ............................................. C23C 16/08
(52) U.S. Cl. .................. 427/564; 427/571; 427/576; 427/250; 427/253; 427/255.39; 118/723 R; 118/723 MP; 118/723 ME; 118/723 ER; 118/723 IR; 156/345.33; 156/345.34; 156/345.35; 156/345.37; 156/345.42; 156/345.46; 156/345.49
(58) Field of Search .................. 427/564, 571, 427/576, 250, 253, 255.39; 118/723 R, 723 MP, 723 ME, 723 ER, 723 IR; 156/345.33, 345.34, 345.35, 345.37, 345.42, 345.46, 345.49

(56) References Cited

U.S. PATENT DOCUMENTS 4,626,448 A 12/1986 Hays (List continued on next page.)

FOREIGN PATENT DOCUMENTS

EP 0 482 265 4/1992

(List continued on next page.)

OTHER PUBLICATIONS

N. Bourhila, et al., Microelectronic Engineering, vol. 33, pp. 25–30, "Copper LPCVD for Advanced Technology", 1997.

*Primary Examiner*—Timothy Meeks
(74) *Attorney, Agent, or Firm*—Oblon, Spivak, McClelland, Maier & Neustadt, P.C.

(57) ABSTRACT

The present invention provides methods and apparatus for the formation of a thin noble metal film which can achieve a high rate of film growth, can use inexpensive raw materials, and do not allow any impurities to remain in the thin film. Specifically, the present invention relates to a method for the formation of a thin metal film which comprises the steps of feeding a chlorine-containing raw material gas 55 into an inlet vessel 11 having a perforated plate 12 made of Cu; converting the raw material gas 55 into a plasma; etching the perforated plate 12 with the raw material gas plasma to produce a precursor 13 composed of the Cu component contained in the perforated plate 12 and the chlorine contained in the raw material gas 55; converting hydrogen gas into a plasma; after discharging the precursor 13 from the inlet vessel 11, passing the precursor 13 through a rotating magnetic field so as to cause the precursor 13 to travel toward a substrate 15 in an accelerated manner; and passing the precursor 13 through the reducing gas plasma to remove chlorine from the precursor 13 and directing the resulting Cu ions onto the substrate 15 to form a thin Cu film 62 on the substrate 15, as well as an apparatus for carrying out this method.

21 Claims, 21 Drawing Sheets

U.S. PATENT DOCUMENTS

| | | | |
|---|---|---|---|
| 4,829,215 A | | 5/1989 | Kim et al. |
| 5,091,209 A | | 2/1992 | Claverie et al. |
| 5,292,370 A | * | 3/1994 | Tsai et al. ............. 118/723 MP |
| 5,716,451 A | * | 2/1998 | Hama et al. ............... 118/723 I |
| 5,980,687 A | * | 11/1999 | Koshimizu ............ 156/345.29 |
| 6,174,809 B1 | | 1/2001 | Kang et al. |
| 6,440,494 B1 | * | 8/2002 | Arena-Foster .............. 427/250 |

FOREIGN PATENT DOCUMENTS

| | | | | |
|---|---|---|---|---|
| EP | 573348 A1 | * | 12/1993 | ........... C23C/16/14 |
| JP | 61-86942 | | 5/1986 | |
| JP | 2856782 | | 5/1991 | |
| JP | 5-85890 | | 4/1993 | |
| JP | 05-198520 | | 8/1993 | |
| JP | 11-238698 | | 8/1999 | |

\* cited by examiner

US 6,656,540 B2

METHOD FOR FORMING METALLIC FILM AND APPARATUS FOR FORMING THE SAME

TECHNICAL FIELD

This invention relates to methods and apparatus for the formation of a thin noble metal film by a plasma-excited vapor phase growth process.

Moreover, this invention also relates to apparatus and methods for forming a metal film on a substrate surface by a vapor phase growth process.

Furthermore, this invention also relates to apparatus for the vapor phase growth of a thin copper film which are useful, for example, in the formation of wiring material films for use in semiconductor devices.

BACKGROUND ART

Conventionally, where it is desired to form a thin noble metal film by a vapor phase growth process, such a film has been formed by the utilization of a thermal reaction using a liquid organometallic complex, such as copper hexafluoroacetylacetonato-trimethylvinylsilane [hereinafter referred to as Cu(hfac)(tmvs)], as a raw material.

FIG. 22 is a schematic view of a conventional apparatus 500 for the vapor phase growth of a thin noble metal film. The method for forming a thin noble metal film 541 on a substrate 515 by using this apparatus 500 is described below. First of all, a liquid raw material 522 comprising Cu(hfac)(tmvs) is contained in a raw material vessel 521, and a carrier gas comprising He gas is bubbled therethrough. The raw material evaporated by bubbling and $H_2$ for reduction reaction are passed through flow controllers 503,506 to control their flow rates, respectively, and fed into an inlet vessel 511 having a vaporizer 520 for vaporizing the raw material completely. Thereafter, the resulting precursor 513 is introduced into a reaction vessel 501 through a perforated plate 512. A substrate 515 is disposed beneath perforated plate 512 and placed on a heater 516. In this method, the growth rate and the film quality have been improved by controlling the flow rates of raw material 522 and $H_2$ for reduction reaction and the growth temperature.

However, the above-described prior art involves the following three problems.

First, since this method is based on the utilization of a thermal reaction induced on the substrate surface by heating substrate 515, it has been difficult to improve the rate of film growth.

Secondly, the organometallic complex [e.g., Cu(hfac)(tmvs)] used as the raw material is expensive.

Thirdly, since hexafluoroacetylacetonato (hfac) and trimethylvinylsilane (tmvs) attached to Cu in Cu(hfac)(tmvs) remain in the thin Cu film (constituting thin film 541) as impurities, it has been difficult to improve the film quality.

Moreover, where it is desired to form a metal film (e.g., a thin copper film) by a vapor phase growth process, it has been conventional practice to use a liquid organometallic complex (e.g., copper hexafluoroacetylacetonato-trimethylvinylsilane) as a raw material, dissolve the solid raw material in a solvent, vaporize it, and form a film on a substrate by the utilization of a thermal reaction.

However, since the prior art involves the formation of a film by the utilization of a thermal reaction, it has been difficult to improve the rate of film growth. Moreover, the metal complex used as the raw material is expensive.

Furthermore, since hexafluoroacetylacetonato and trimethylvinylsilane attached to Cu remain in the thin Cu film as impurities, it has been difficult to improve the film quality.

Furthermore, a thin copper (Cu) film has conventionally been formed by physical film-forming processes such as vacuum evaporation, ion plating and sputtering, and a chemical vapor phase growth process (CVD process). Among others, the CVD process is widely employed because of its excellent surface covering properties.

According to a conventionally known method for the formation of a thin copper film by the CVD process, a liquid organocopper complex such as copper hexafluoroacetylacetonato-trimethylvinylsilane [hereinafter referred to as Cu(hfac)(tmvs)] is used as a raw material. This raw material is evaporated, carried to a desired surface of a substrate to be treated, and thermally decomposed to form a thin copper film on the substrate surface.

The above-described method for the formation of a thin copper metal is more specifically described with reference to FIG. 23 illustrating an apparatus 600 for the vapor phase growth of a thin copper film. First of all, a substrate 603 to be treated is placed on a flat plate type heater 602 within a reaction vessel 601. The gas within the aforesaid reaction vessel 601 is discharged through an exhaust pipe 604 until a predetermined degree of vacuum is reached. Subsequently, a carrier gas such as He is fed through a pipe 607a and bubbled through a raw material 605 [i.e., Cu(hfac)(tmvs)] contained in a raw material vessel 606. The raw material gas obtained by bubbling and a reducing gas (e.g., hydrogen) are conducted through pipes 607b and 607c, respectively, and fed into a vaporizer 608 disposed in the upper part of the aforesaid reaction vessel 601. The flow rates of the aforesaid raw material gas and hydrogen gas are controlled by flow controllers 609 and 610 installed in the respective pipes 607b and 607c. After the raw material gas is completely vaporized in the aforesaid vaporizer 608, a mixed gas 613 composed of the raw material gas and hydrogen gas is discharged through a plurality of discharge orifices 612 of a discharge plate 611 disposed at the bottom of vaporizer 608 so as to travel toward the aforesaid substrate 603 placed on the aforesaid heater 602. Since the aforesaid substrate 603 is heated to a predetermined temperature by the aforesaid flat plate type heater 602, the aforesaid raw material, or Cu(hfac)(tmvs), is thermally decomposed on the surface of substrate 603 to form a thin copper film 614 thereon. During this film formation, the oxidation of copper is prevented by the reducing action of hydrogen. By controlling the flow rates of the aforesaid raw material and hydrogen and the heating temperature by heater 602, the rate of copper film growth can be regulated and the film quality can be improved.

However, the above-described conventional method for the formation of a thin copper film involves the following three problems.

First, since the above-described method for the formation of a thin copper film is based on the thermal decomposition of vaporized Cu(hfac)(tmvs), it is difficult to improve the rate of film growth. Secondly, the organocopper complex [e.g., Cu(hfac)(tmvs)] used as the raw material is expensive and hence raises the cost of the resulting thin copper film. Thirdly, since hexafluoroacetylacetonato (hfac) and trimethylvinylsilane (tmvs) are incorporated into the thin copper film during its formation and remain therein as impurities, the film quality tends to be reduced.

The present invention has been made in view of the above-described circumstances, and an object thereof is to provide methods and apparatus for the formation of a thin noble metal film which can achieve a high rate of film growth, can use inexpensive raw materials, and do not allow any impurities to remain in the thin film.

Another object of the present invention is to provide methods and apparatus for the formation of a metal film which can achieve a high rate of film growth, can use inexpensive raw materials, and do not allow any impurities to remain in the film.

Still another object of the present invention is to provide an apparatus for the vapor phase growth of a thin copper film which uses inexpensive chlorine or hydrogen chloride as a raw material gas, can achieve a high rate of film growth, and can form a thin copper film of good quality containing little residual impurity and having a desired film thickness.

DISCLOSURE OF THE INVENTION

In order to accomplish the above objects, the present invention provides a method for the formation of a metal film which comprises the steps of feeding a raw material gas containing a halogen into an inlet vessel having a perforated plate made of metal; converting the raw material gas into a plasma to generate a raw material gas plasma; etching the perforated plate with the raw material gas plasma to produce a precursor composed of the metallic component contained in the perforated plate and the halogen contained in the raw material gas; converting a reducing gas into a plasma to generate a reducing gas plasma; after discharging the precursor from the inlet vessel, passing the precursor through a rotating magnetic field so as to cause the precursor to travel toward a substrate in an accelerated manner; and passing the precursor through the reducing gas plasma to remove the halogen from the precursor and directing the resulting metallic ion or neutral metal onto the substrate to form a thin metal film on the substrate.

The aforesaid metallic ion is a metal atom which has been ionized by the release of an electron or electrons, and the aforesaid neutral metal is a metal atom which has not been ionized.

The aforesaid perforated plate is preferably made of Cu or a noble metal such as Ag, Au or Pt. For example, when a perforated plate made of Cu is used, $Cu_xCl_y$ is produced as the aforesaid precursor. Consequently, Cu ions are directed onto the substrate to form a thin Cu film.

Since two plasmas (i.e., the raw material gas plasma and the reducing gas plasma) are used in this method, the reaction efficiency is markedly improved to cause an increase in rate of film growth. Moreover, since a chlorine-containing gas is used as the raw material gas and a hydrogen-containing gas is used as the reducing gas, a marked reduction in cost is achieved. Furthermore, since the reduction reaction can be accelerated independently, the amount of impurities (e.g., chlorine) remaining in the thin film can be minimized to form a thin film of high quality.

According to another embodiment of the present invention, the above objects are accomplished by providing a method for the formation of a metal film which comprises the steps of feeding a raw material gas containing a halogen into an inlet vessel having a perforated plate made of metal; converting the raw material gas into a plasma to generate a raw material gas plasma; etching the perforated plate with the raw material gas plasma to produce a precursor composed of the metallic component contained in the perforated plate and the halogen contained in the raw material gas; converting a reducing gas into a plasma to generate a reducing gas plasma; and passing the precursor through the reducing gas plasma to remove the halogen from the precursor and directing the resulting metallic ion or neutral metal onto the substrate to form a thin metal film on the substrate.

The aforesaid perforated plate is preferably made of Cu or a noble metal such as Ag, Au or Pt. For example, when a perforated plate made of Cu is used, $Cu_xCl_y$ is produced as the aforesaid precursor. Consequently, Cu ions are directed onto the substrate to form a thin Cu film.

In order to generate the aforesaid reducing gas plasma, there may be used an electrode to which high-frequency electric power is applied. For example, the precursor diffusing toward the aforesaid substrate may be reduced by disposing an electrode opposite to the substrate and generating a plasma all over the electrode.

Since two plasmas (i.e., the raw material gas plasma and the reducing gas plasma) are used in this method, the reaction efficiency is markedly improved to cause an increase in rate of film growth. Moreover, since a halogen-containing gas is used as the raw material gas and a hydrogen-containing gas is used as the reducing gas, a marked reduction in cost is achieved. Furthermore, since the reduction reaction can be accelerated independently, the amount of impurities (e.g., chlorine) remaining in the thin film can be minimized to form a thin film of high quality.

According to still another embodiment of the present invention, there is provided a method for the formation of a metal film which comprises the steps of feeding a raw material gas containing a halogen into an inlet vessel having a perforated plate made of metal; converting the raw material gas into a plasma to generate a raw material gas plasma; etching the perforated plate with the raw material gas plasma to produce a precursor composed of the metallic component contained in the perforated plate and the halogen contained in the raw material gas; producing an atomic reducing gas between the perforated plate and a substrate by heating a reducing gas to a high temperature; and, after discharging the precursor from the inlet vessel, passing the precursor through the atomic reducing gas to remove the halogen from the precursor and directing the resulting metallic ion or neutral metal onto the substrate to form a thin metal film on the substrate.

According to this method, the reaction efficiency is markedly improved to cause an increase in rate of film growth. Moreover, since a halogen-containing gas is used as the raw material gas and a hydrogen-containing gas is used as the reducing gas, a marked reduction in cost is achieved. Furthermore, since the reduction reaction can be accelerated independently, the amount of impurities (e.g., chlorine) remaining in the thin film can be minimized to form a thin film of high quality.

According to a further embodiment of the present invention, there is provided a method for the formation of a metal film which comprises the steps of bringing a raw material gas containing a halogen into contact with a hot metallic filament and thereby etching the filament with the raw material gas to produce a precursor composed of the metallic component contained in the filament and the halogen contained in the raw material gas; producing an atomic reducing gas by heating a reducing gas to a high temperature; and passing the precursor through the atomic reducing gas to remove the halogen from the precursor and directing the resulting metallic ion or neutral metal onto a substrate to form a thin metal film on the substrate.

According to the above-described method, the reaction efficiency is markedly improved to cause an increase in rate of film growth. Moreover, since a halogen-containing gas is used as the raw material gas and a hydrogen-containing gas is used as the reducing gas, a marked reduction in cost is achieved. Furthermore, since the reduction reaction can be accelerated independently, the amount of impurities (e.g., chlorine) remaining in the thin film can be minimized to form a thin film of high quality.

According to still a further embodiment of the present invention, there is provided a method for the formation of a metal film which comprises the steps of bringing a raw material gas containing a halogen into contact with a hot metallic filament and thereby etching the filament with the raw material gas to produce a precursor composed of the metallic component contained in the filament and the halogen contained in the raw material gas; utilizing high-frequency electric power for the purpose of converting a reducing gas into a plasma to generate a reducing gas plasma; and passing the precursor through the reducing gas plasma to remove the halogen from the precursor and directing the resulting metallic ion or neutral metal onto a substrate to form a thin metal film on the substrate.

According to the above-described method, the reaction efficiency is markedly improved to cause an increase in rate of film growth. Moreover, since a halogen-containing gas is used as the raw material gas and a hydrogen-containing gas is used as the reducing gas, a marked reduction in cost is achieved. Furthermore, since the reduction reaction can be accelerated independently, the amount of impurities (e.g., chlorine) remaining in the thin film can be minimized to form a thin film of high quality.

In the methods for forming a metal film in accordance with the present invention, a halogen gas, a hydrogen halide gas, or a mixed gas composed of these gases is used as the aforesaid raw material gas. For example, there may be used fluorine gas, chlorine gas, bromine gas, iodine gas, and hydrogen halide gases formed by the combination of these halogens with hydrogen. Among these gases, hydrogen chloride gas has higher reaction efficiency than chlorine gas. consequently, the use of hydrogen chloride gas can decrease the amount of reducing gas used and hence cause a reduction in cost.

Moreover, the above-described steps extending from the feeding of a raw material gas to the production of a precursor may be replace by a method comprising the step of bubbling a carrier gas (e.g., He) through a liquid organometallic complex to evaporate it, and the step of vaporizing the evaporated organometallic complex in a vaporizer or the like and introducing the resulting vapor into the reaction vessel.

According to these methods, the reducing gas plasma decomposes the impurities (e.g., halogen compounds and carbon compounds) contained in the raw material gas, the amount of impurities remaining in the thin metal film can be reduced.

According to the present invention, there is also provided an apparatus for the formation of a metal film which comprises an inlet vessel equipped with a metallic perforated plate having discharge orifices bored therethrough and adapted to receive a raw material gas in its internal volume; a first plasma generator for converting the raw material gas received in the inlet vessel into a plasma and thereby generating a raw material gas plasma; a reaction vessel housing the inlet vessel and a substrate; a rotating magnetic field generator for creating a rotating magnetic field between the perforated plate and the substrate; and a second plasma generator for generating a plasma from a reducing gas fed into the reaction vessel.

As the aforesaid rotating magnetic field generator, there may be used, for example, a device comprising a rotating magnetic field coil disposed on the side of the reaction vessel, and a power supply for passing a high electric current through the rotating magnetic field coil.

According to another embodiment of the present invention, there is provided an apparatus for the formation of a metal film which comprises an inlet vessel equipped with a metallic perforated plate having discharge orifices bored therethrough and adapted to receive a raw material gas in its internal volume; a first plasma generator for converting the raw material gas received in the inlet vessel into a plasma and thereby generating a raw material gas plasma; a reaction vessel housing the inlet vessel and a substrate; and a meshlike, ladderlike or comblike electrode for generating a plasma from a reducing gas fed into the reaction vessel by applying high-frequency electric power thereto.

By providing the electrode surface with holes or openings, the flux of the precursor can be subjected to a reduction reaction uniformly, without preventing the precursor from traveling toward the substrate.

According to still another embodiment of the present invention, there is provided an apparatus for the formation of a metal film which comprises an inlet vessel equipped with a metallic perforated plate having discharge orifices bored therethrough and adapted to receive a raw material gas in its internal volume; a plasma generator for converting the raw material gas received in the inlet vessel into a plasma and thereby generating a raw material gas plasma; a reaction vessel housing the inlet vessel and a substrate; and a reducing gas heating device for heating a reducing gas fed into the reaction vessel.

As the aforesaid reducing gas heating device, there may preferably be used, for example, a tungsten filament heated to a high temperature by passing a high electric current therethrough. When a reducing gas is made to flow through the filament, an atomic reducing gas is produced.

According to a further embodiment of the present invention, there is provided an apparatus for the formation of a metal film which comprises a precursor feeding device for bringing a raw material gas into contact with a hot metallic filament to produce a precursor and feeding the precursor into a reaction vessel; the reaction vessel housing a substrate; and a reducing gas heating device for heating a reducing gas fed into the reaction vessel.

According to still a further embodiment of the present invention, there is provided an apparatus for the formation of a metal film which comprises a precursor feeding device for bubbling a carrier gas through a liquid organometallic complex, vaporizing the organometallic complex, producing a precursor from the vaporized organometallic complex, and feeding the precursor into a reaction vessel; the reaction vessel housing a substrate; a rotating magnetic field generator for creating a rotating magnetic field in a space above the substrate; and a second plasma generator for generating a plasma from a reducing gas fed into the reaction vessel.

According to still a further embodiment of the present invention, there is provided an apparatus for the formation of a metal film which comprises a precursor feeding device for bubbling a carrier gas through a liquid organometallic complex, vaporizing the organometallic complex, producing a precursor from the vaporized organometallic complex, and feeding the precursor into a reaction vessel; the reaction vessel housing a substrate; and a meshlike, ladderlike or comblike electrode for generating a plasma from a reducing gas fed into the reaction vessel by applying high-frequency electric power thereto.

By employing these methods and apparatus for the formation of a metal film in accordance with the present invention, a thin metal film of high quality showing no precipitation of impurities can be rapidly formed at low cost.

According to still a further embodiment of the present invention, the above objects are accomplished by providing an apparatus for the formation of a metal film, the apparatus comprising an inlet vessel equipped with a metallic discharge plate having a multitude of discharge orifices bored therethrough and adapted to receive a chlorine-containing raw material gas in its internal volume; a chamber housing the inlet vessel and a substrate; first plasma generating means for converting the raw material gas within the inlet vessel into a plasma to generate a raw material gas plasma, and thereby etching the discharge plate with the raw material gas plasma to produce a precursor composed of the metallic component contained in the discharge plate and the chlorine contained in the raw material gas; second plasma generating means for converting a hydrogen-containing reducing gas within the chamber into a plasma to generate a reducing gas plasma; and chamber heating means for heating the chamber to a predetermined temperature; whereby the precursor is passed through the reducing gas plasma within the chamber to remove chlorine from the precursor by reduction, without allowing the precursor to deposit on the heated inner wall of the chamber, and the resulting metallic ion is directed onto the substrate to form a metal film on the substrate.

According to still a further embodiment of the present invention, the above objects are accomplished by providing an apparatus for the formation of a metal film, the apparatus comprising an inlet vessel equipped with a metallic discharge plate having a multitude of discharge orifices bored therethrough and adapted to receive a chlorine-containing raw material gas in its internal volume; discharge plate heating means for heating the discharge plate to a predetermined temperature; a chamber housing the inlet vessel and a substrate; first plasma generating means for converting the raw material gas within the inlet vessel into a plasma to generate a raw material gas plasma, and thereby etching the discharge plate with the raw material gas plasma to produce a precursor composed of the metallic component contained in the discharge plate and the chlorine contained in the raw material gas; and second plasma generating means for converting a hydrogen-containing reducing gas within the chamber into a plasma to generate a reducing gas plasma; whereby the precursor, which has been produced by etching the heated discharge plate and is hence easy to reduce, is passed through the reducing gas plasma to remove chlorine from the precursor by reduction, and the resulting metallic ion is directed onto the substrate to form a metal film on the substrate.

According to still a further embodiment of the present invention, the above objects are accomplished by providing an apparatus for the formation of a metal film, the apparatus comprising an inlet vessel equipped with a metallic discharge plate having a multitude of discharge orifices bored therethrough and adapted to receive a chlorine-containing raw material gas in its internal volume; discharge plate heating means for heating the discharge plate to a predetermined temperature; a chamber housing the inlet vessel and a substrate; first plasma generating means for converting the raw material gas within the inlet vessel into a plasma to generate a raw material gas plasma, and thereby etching the discharge plate with the raw material gas plasma to produce a precursor composed of the metallic component contained in the discharge plate and the chlorine contained in the raw material gas; second plasma generating means for converting a hydrogen-containing reducing gas within the chamber into a plasma to generate a reducing gas plasma; and chamber heating means for heating the chamber to a predetermined temperature; whereby the precursor, which has been produced by etching the heated discharge plate and is hence easy to reduce, is passed through the reducing gas plasma to remove chlorine from the precursor by reduction, without allowing the precursor to deposit on the heated inner wall of the chamber, and the resulting metallic ion is directed onto the substrate to form a metal film on the substrate.

According to still a further embodiment of the present invention, the above objects are accomplished by providing an apparatus for the formation of a metal film, the apparatus comprising an inlet vessel equipped with a metallic discharge plate having a multitude of discharge orifices bored therethrough and adapted to receive a chlorine-containing raw material gas in its internal volume; a chamber housing the inlet vessel and a substrate; first plasma generating means for converting the raw material gas within the inlet vessel into a plasma to generate a raw material gas plasma, and thereby etching the discharge plate with the raw material gas plasma to produce a precursor composed of the metallic component contained in the discharge plate and the chlorine contained in the raw material gas; reducing gas heating means for heating a hydrogen-containing reducing gas to a high temperature and thereby producing an atomic reducing gas within the chamber between the substrate and the discharge plate; and chamber heating means for heating the chamber to a predetermined temperature; whereby the precursor is passed through the atomic reducing gas within the chamber to remove chlorine from the precursor by reduction, without allowing the precursor to deposit on the heated inner wall of the chamber, and the resulting metallic ion is directed onto the substrate to form a metal film on the substrate.

According to still a further embodiment of the present invention, the above objects are accomplished by providing an apparatus for the formation of a metal film, the apparatus comprising an inlet vessel equipped with a metallic discharge plate having a multitude of discharge orifices bored therethrough and adapted to receive a chlorine-containing raw material gas in its internal volume; discharge plate heating means for heating the discharge plate to a predetermined temperature; a chamber housing the inlet vessel and a substrate; first plasma generating means for converting the raw material gas within the inlet vessel into a plasma to generate a raw material gas plasma, and thereby etching the discharge plate with the raw material gas plasma to produce a precursor composed of the metallic component contained in the discharge plate and the chlorine contained in the raw material gas; and reducing gas heating means for heating a hydrogen-containing reducing gas to a high temperature and thereby producing an atomic reducing gas within the chamber between the substrate and the discharge plate; whereby the precursor, which has been produced by etching the heated discharge plate and is hence easy to reduce, is passed through the atomic reducing gas to remove chlorine from the precursor by reduction, and the resulting metallic ion is directed onto the substrate to form a metal film on the substrate.

According to still a further embodiment of the present invention, the above objects are accomplished by providing an apparatus for the formation of a metal film, the apparatus comprising an inlet vessel equipped with a metallic discharge plate having a multitude of discharge orifices bored therethrough and adapted to receive a chlorine-containing raw material gas in its internal volume; discharge plate heating means for heating the discharge plate to a predetermined temperature; a chamber housing the inlet vessel and a substrate; first plasma generating means for converting the raw material gas within the inlet vessel into a plasma to generate a raw material gas plasma, and thereby etching the discharge plate with the raw material gas plasma to produce a precursor composed of the metallic component contained in the discharge plate and the chlorine contained in the raw material gas; reducing gas heating means for heating a hydrogen-containing reducing gas to a high temperature and thereby producing an atomic reducing gas within the chamber between the substrate and the discharge plate; and chamber heating means for heating the chamber to a predetermined temperature; whereby the precursor, which has been produced by etching the heated discharge plate and is hence easy to reduce, is passed through the atomic reducing gas within the chamber to remove chlorine from the precursor by reduction, without allowing the precursor to deposit on the heated inner wall of the chamber, and the resulting metallic ion is directed onto the substrate to form a metal film on the substrate.

According to still a further embodiment of the present invention, the above objects are accomplished by providing an apparatus for the formation of a metal film, the apparatus comprising precursor feeding means for bringing a chlorine-containing raw material gas into contact with a hot metallic filament to produce a precursor within a chamber housing a substrate, the precursor being composed of the metallic component contained in the metallic filament and the chlorine contained in the raw material gas; reducing gas heating means for heating a hydrogen-containing reducing gas to a high temperature and thereby producing an atomic reducing gas within the chamber between the substrate and the discharge plate; and chamber heating means for heating the chamber to a predetermined temperature; whereby the precursor is passed through the atomic reducing gas within the chamber to remove chlorine from the precursor by reduction, without allowing the precursor to deposit on the heated inner wall of the chamber, and the resulting metallic ion is directed onto the substrate to form a metal film on the substrate.

In these apparatus, the discharge plate or metallic filament may be made of copper, so that $Cu_xCl_y$ is produced as the aforesaid precursor. Moreover, the discharge plate may be made of copper and the predetermined temperature to which the discharge plate is heated by the discharge plate heating means may be in the range of 200 to 800° C. Furthermore, the discharge plate heating means may comprise means for heating the discharge plate by introducing a rare gas into the inlet vessel, using the first plasma generating means to generate a rare gas plasma, and applying a voltage so as to cause the rare gas component ion to collide with the discharge plate.

In this case, the predetermined temperature is preferably 600° C. When $Cu_xCl_y$ is produced as the aforesaid precursor, the predetermined temperature to which the chamber is heated by the chamber heating means is preferably about 200° C. In addition to Cu, Ag, Au, Pt, Ti, W and the like may be used for the discharge plate or metallic filament. As the raw material gas, there may be used chlorine gas, hydrogen chloride gas or a mixed gas composed of these gases.

In order to accomplish the above objects, the present invention also provides a method for the formation of a metal film which comprises reacting chlorine with a metallic plate within a chamber to produce a precursor composed of a metallic component and chlorine, removing chlorine from the precursor by reduction, and directing the resulting metallic ion onto a substrate within the chamber to form a metal film on the substrate, the method being characterized in that the chamber is heated to a predetermined temperature so as to prevent the precursor from depositing on the inner wall of the chamber.

In order to accomplish the above objects, the present invention also provides a method for the formation of a metal film which comprises reacting chlorine with a metallic plate within a chamber to produce a precursor composed of a metallic component and chlorine, removing chlorine from the precursor by reduction, and directing the resulting metallic ion onto a substrate within the chamber to form a metal film on the substrate, the method being characterized in that the metallic plate is heated to a predetermined temperature so as to make the precursor easy to reduce.

According to another embodiment of the present invention, the above objects are accomplished by providing a method for the formation of a metal film which comprises reacting chlorine with a metallic plate within a chamber to produce a precursor composed of a metallic component and chlorine, removing chlorine from the precursor by reduction, and directing the resulting metallic ion onto a substrate within the chamber to form a metal film on the substrate, the method being characterized in that the chamber is heated to a predetermined temperature so as to prevent the precursor from depositing on the inner wall of the chamber and, moreover, the metallic plate is heated to a predetermined temperature so as to make the precursor easy to reduce.

In these methods, the metallic plate may be made of copper, so that $Cu_xCl_y$ is produced as the aforesaid precursor.

According to still a further embodiment of the present invention, there is provided an apparatus for the formation of a metal film, the apparatus comprising an inlet vessel equipped with a metallic discharge plate having a multitude of discharge orifices bored therethrough and adapted to receive a chlorine-containing raw material gas in its internal volume; a chamber housing the inlet vessel and a substrate; first plasma generating means for converting the raw material gas within the inlet vessel into a plasma to generate a raw material gas plasma, and thereby etching the discharge plate with the raw material gas plasma to produce a precursor composed of the metallic component contained in the discharge plate and the chlorine contained in the raw material gas; second plasma generating means for converting a hydrogen-containing reducing gas within the chamber into a plasma to generate a reducing gas plasma; and chamber heating means for heating the chamber to a predetermined temperature; whereby the precursor is passed through the reducing gas plasma within the chamber to remove chlorine from the precursor by reduction, without allowing the precursor to deposit on the heated inner wall of the chamber, and the resulting metallic ion is directed onto the substrate to form a metal film on the substrate. Thus, the precursor is prevented from depositing on the inner wall of the chamber. Consequently, a high rate of film growth can be achieved, an inexpensive raw material can be used, and an apparatus for the formation of a metal film containing no residual impurities can be obtained. Moreover, the necessity of cleaning the inside of the chamber periodically can be eliminated to cause an improvement in raw material efficiency and a reduction in running cost.

According to still a further embodiment of the present invention, there is provided an apparatus for the formation of a metal film, the apparatus comprising an inlet vessel equipped with a metallic discharge plate having a multitude of discharge orifices bored therethrough and adapted to receive a chlorine-containing raw material gas in its internal volume; discharge plate heating means for heating the discharge plate to a predetermined temperature; a chamber housing the inlet vessel and a substrate; first plasma generating means for converting the raw material gas within the inlet vessel into a plasma to generate a raw material gas plasma, and thereby etching the discharge plate with the raw material gas plasma to produce a precursor composed of the metallic component contained in the discharge plate and the chlorine contained in the raw material gas; and second plasma generating means for converting a hydrogen-containing reducing gas within the chamber into a plasma to generate a reducing gas plasma; whereby the precursor, which has been produced by etching the heated discharge plate and is hence easy to reduce, is passed through the reducing gas plasma to remove chlorine from the precursor by reduction, and the resulting metallic ion is directed onto the substrate to form a metal film on the substrate. Thus, a monomeric precursor which can be easily reduced tends to be produced. Consequently, a high rate of film growth can be achieved, an inexpensive raw material can be used, and an apparatus for the formation of a metal film containing no residual impurities can be obtained. Moreover, chlorine can be removed by reduction in a short period of time, resulting in a further improvement in the rate of film growth.

According to still a further embodiment of the present invention, there is provided an apparatus for the formation of a metal film, the apparatus comprising an inlet vessel equipped with a metallic discharge plate having a multitude of discharge orifices bored therethrough and adapted to receive a chlorine-containing raw material gas in its internal volume; discharge plate heating means for heating the discharge plate to a predetermined temperature; a chamber housing the inlet vessel and a substrate; first plasma generating means for converting the raw material gas within the inlet vessel into a plasma to generate a raw material gas plasma, and thereby etching the discharge plate with the raw material gas plasma to produce a precursor composed of the metallic component contained in the discharge plate and the chlorine contained in the raw material gas; second plasma generating means for converting a hydrogen-containing reducing gas within the chamber into a plasma to generate a reducing gas plasma; and chamber heating means for heating the chamber to a predetermined temperature; whereby the precursor, which has been produced by etching the heated discharge plate and is hence easy to reduce, is passed through the reducing gas plasma to remove chlorine from the precursor by reduction, without allowing the precursor to deposit on the heated inner wall of the chamber, and the resulting metallic ion is directed onto the substrate to form a metal film on the substrate. Thus, the precursor is prevented from depositing on the inner wall of the chamber and, moreover, a monomeric precursor which can be easily reduced tends to be produced. Consequently, a high rate of film growth can be achieved, an inexpensive raw material can be used, and an apparatus for the formation of a metal film containing no residual impurities can be obtained. Moreover, the necessity of cleaning the inside of the chamber periodically can be eliminated to cause an improvement in raw material efficiency and a reduction in running cost. Furthermore, chlorine can be removed by reduction in a short period of time, resulting in a further improvement in the rate of film growth.

According to still a further embodiment of the present invention, there is provided an apparatus for the formation of a metal film, the apparatus comprising an inlet vessel equipped with a metallic discharge plate having a multitude of discharge orifices bored therethrough and adapted to receive a chlorine-containing raw material gas in its internal volume; a chamber housing the inlet vessel and a substrate; first plasma generating means for converting the raw material gas within the inlet vessel into a plasma to generate a raw material gas plasma, and thereby etching the discharge plate with the raw material gas plasma to produce a precursor composed of the metallic component contained in the discharge plate and the chlorine contained in the raw material gas; reducing gas heating means for heating a hydrogen-containing reducing gas to a high temperature and thereby producing an atomic reducing gas within the chamber between the substrate and the discharge plate; and chamber heating means for heating the chamber to a predetermined temperature; whereby the precursor is passed through the atomic reducing gas within the chamber to remove chlorine from the precursor by reduction, without allowing the precursor to deposit on the heated inner wall of the chamber, and the resulting metallic ion is directed onto the substrate to form a metal film on the substrate. Thus, the precursor is prevented from depositing on the inner wall of the chamber. Consequently, a high rate of film growth can be achieved, an inexpensive raw material can be used, and an apparatus for the formation of a metal film containing no residual impurities can be obtained. Moreover, the necessity of cleaning the inside of the chamber periodically can be eliminated to cause an improvement in raw material efficiency and a reduction in running cost.

According to still a further embodiment of the present invention, there is provided an apparatus for the formation of a metal film, the apparatus comprising an inlet vessel equipped with a metallic discharge plate having a multitude of discharge orifices bored therethrough and adapted to receive a chlorine-containing raw material gas in its internal volume; discharge plate heating means for heating the discharge plate to a predetermined temperature; a chamber housing the inlet vessel and a substrate; first plasma generating means for converting the raw material gas within the inlet vessel into a plasma to generate a raw material gas plasma, and thereby etching the discharge plate with the raw material gas plasma to produce a precursor composed of the metallic component contained in the discharge plate and the chlorine contained in the raw material gas; and reducing gas heating means for heating a hydrogen-containing reducing gas to a high temperature and thereby producing an atomic reducing gas within the chamber between the substrate and the discharge plate; whereby the precursor, which has been produced by etching the heated discharge plate and is hence easy to reduce, is passed through the atomic reducing gas to remove chlorine from the precursor by reduction, and the resulting metallic ion is directed onto the substrate to form a metal film on the substrate. Thus, a monomeric precursor which can be easily reduced tends to be produced. Consequently, a high rate of film growth can be achieved, an inexpensive raw material can be used, and an apparatus for the formation of a metal film containing no residual impurities can be obtained. Moreover, chlorine can be removed by reduction in a short period of time, resulting in a further improvement in the rate of film growth.

According to still a further embodiment of the present invention, there is provided an apparatus for the formation of a metal film, the apparatus comprising an inlet vessel equipped with a metallic discharge plate having a multitude of discharge orifices bored therethrough and adapted to receive a chlorine-containing raw material gas in its internal volume; discharge plate heating means for heating the discharge plate to a predetermined temperature; a chamber housing the inlet vessel and a substrate; first plasma generating means for converting the raw material gas within the inlet vessel into a plasma to generate a raw material gas plasma, and thereby etching the discharge plate with the raw material gas plasma to produce a precursor composed of the metallic component contained in the discharge plate and the chlorine contained in the raw material gas; reducing gas heating means for heating a hydrogen-containing reducing gas to a high temperature and thereby producing an atomic reducing gas within the chamber between the substrate and the discharge plate; and chamber heating means for heating the chamber to a predetermined temperature; whereby the precursor, which has been produced by etching the heated discharge plate and is hence easy to reduce, is passed through the atomic reducing gas within the chamber to remove chlorine from the precursor by reduction, without allowing the precursor to deposit on the heated inner wall of the chamber, and the resulting metallic ion is directed onto the substrate to form a metal film on the substrate. Thus, the precursor is prevented from depositing on the inner wall of the chamber and, moreover, a monomeric precursor which can be easily reduced tends to be produced. Consequently, a high rate of film growth can be achieved, an inexpensive raw material can be used, and an apparatus for the formation of a metal film containing no residual impurities can be obtained. Moreover, the necessity of cleaning the inside of the chamber periodically can be eliminated to cause an improvement in raw material efficiency and a reduction in running cost. Furthermore, chlorine can be removed by reduction in a short period of time, resulting in a further improvement in the rate of film growth.

According to still a further embodiment of the present invention, the above objects are accomplished by providing an apparatus for the formation of a metal film, the apparatus comprising precursor feeding means for bringing a chlorine-containing raw material gas into contact with a hot metallic filament to produce a precursor within a chamber housing a substrate, the precursor being composed of the metallic component contained in the metallic filament and the chlorine contained in the raw material gas; reducing gas heating means for heating a hydrogen-containing reducing gas to a high temperature and thereby producing an atomic reducing gas within the chamber between the substrate and the discharge plate; and chamber heating means for heating the chamber to a predetermined temperature; whereby the precursor is passed through the atomic reducing gas within the chamber to remove chlorine from the precursor by reduction, without allowing the precursor to deposit on the heated inner wall of the chamber, and the resulting metallic ion is directed onto the substrate to form a metal film on the substrate. Thus, the precursor is prevented from depositing on the inner wall of the chamber. Consequently, a high rate of film growth can be achieved, an inexpensive raw material can be used, and an apparatus for the formation of a metal film containing no residual impurities can be obtained. Moreover, the necessity of cleaning the inside of the chamber periodically can be eliminated to cause an improvement in raw material efficiency and a reduction in running cost.

According to still a further embodiment of the present invention, there is provided a method for the formation of a metal film which comprises reacting chlorine with a metallic plate within a chamber to produce a precursor composed of a metallic component and chlorine, removing chlorine from the precursor by reduction, and directing the resulting metallic ion onto a substrate within the chamber to form a metal film on the substrate, the method being characterized in that the chamber is heated to a predetermined temperature so as to prevent the precursor from depositing on the inner wall of the chamber. Thus, the precursor is prevented from depositing on the inner wall of the chamber. Consequently, a high rate of film growth can be achieved, an inexpensive raw material can be used, and an apparatus for the formation of a metal film containing no residual impurities can be obtained. Moreover, the necessity of cleaning the inside of the chamber periodically can be eliminated to cause an improvement in raw material efficiency and a reduction in running cost.

According to still a further embodiment of the present invention, there is provided a method for the formation of a metal film which comprises reacting chlorine with a metallic plate within a chamber to produce a precursor composed of a metallic component and chlorine, removing chlorine from the precursor by reduction, and directing the resulting metallic ion onto a substrate within the chamber to form a metal film on the substrate, the method being characterized in that the metallic plate is heated to a predetermined temperature so as to make the precursor easy to reduce. Thus, a monomeric precursor which can be easily reduced tends to be produced. Consequently, a high rate of film growth can be achieved, an inexpensive raw material can be used, and an apparatus for the formation of a metal film containing no residual impurities can be obtained. Moreover, chlorine can be removed by reduction in a short period of time, resulting in a further improvement in the rate of film growth.

According to still a further embodiment of the present invention, there is provided a method for the formation of a metal film which comprises reacting chlorine with a metallic plate within a chamber to produce a precursor composed of a metallic component and chlorine, removing chlorine from the precursor by reduction, and directing the resulting metallic ion onto a substrate within the chamber to form a metal film on the substrate, the method being characterized in that the chamber is heated to a predetermined temperature so as to prevent the precursor from depositing on the inner wall of the chamber and, moreover, the metallic plate is heated to a predetermined temperature so as to make the precursor easy to reduce. Thus, the precursor is prevented from depositing on the inner wall of the chamber and, moreover, a monomeric precursor which can be easily reduced tends to be produced. Consequently, a high rate of film growth can be achieved, an inexpensive raw material can be used, and an apparatus for the formation of a metal film containing no residual impurities can be obtained. Moreover, the necessity of cleaning the inside of the chamber periodically can be eliminated to cause an improvement in raw material efficiency and a reduction in running cost. Furthermore, chlorine can be removed by reduction in a short period of time, resulting in a further improvement in the rate of film growth.

According to still a further embodiment of the present invention, there is provided an apparatus for the formation of a metal film, the apparatus comprising:

a reaction vessel in which a substrate to be treated is placed;

an inlet vessel disposed within the reaction vessel and equipped with a copper discharge plate having a plurality of discharge orifices bored therethrough;

temperature control means attached to the copper discharge plate;

a raw material gas feed pipe inserted into the inlet vessel for feeding chlorine or hydrogen chloride;

plasma generating means for generating a plasma of chlorine or hydrogen chloride within the inlet vessel;

atomic reducing gas producing means for producing an atomic reducing gas within the reaction vessel, at least in the neighborhood of the substrate to be treated; and evacuation means for evacuating any gas from the reaction vessel and the inlet vessel.

According to still a further embodiment of the present invention, there is provided an apparatus for the formation of a metal film, the apparatus comprising:

a reaction vessel in which a substrate to be treated is placed;

a raw material gas feed pipe inserted into the inlet vessel for feeding chlorine or hydrogen chloride;

a spiral tube attached to the inner end of the raw material gas feed pipe, having a raw material gas flow passage whose inner surface is made of copper, and equipped with a heating element;

atomic reducing gas producing means for producing an atomic reducing gas within the reaction vessel, at least in the neighborhood of the substrate to be treated; and evacuation means for evacuating any gas from the reaction vessel and the raw material gas flow passage.

As specifically described above, the present invention makes it possible to achieve a high rate of film growth while using inexpensive chlorine or hydrogen chloride as a raw material gas, and to form a thin copper film of good quality containing little residual impurities and having a desired film thickness, with good reproducibility. Thus, the present invention can provide an apparatus for the vapor phase growth of a thin copper film which is useful, for example, in the formation of wiring material films for use in semiconductor devices and liquid crystal displays.

BEST MODE FOR CARRYING OUT THE INVENTION

Various embodiments of the present invention will be specifically described hereinbelow with reference to the accompanying drawings.

[First Embodiment]

Figure 1:
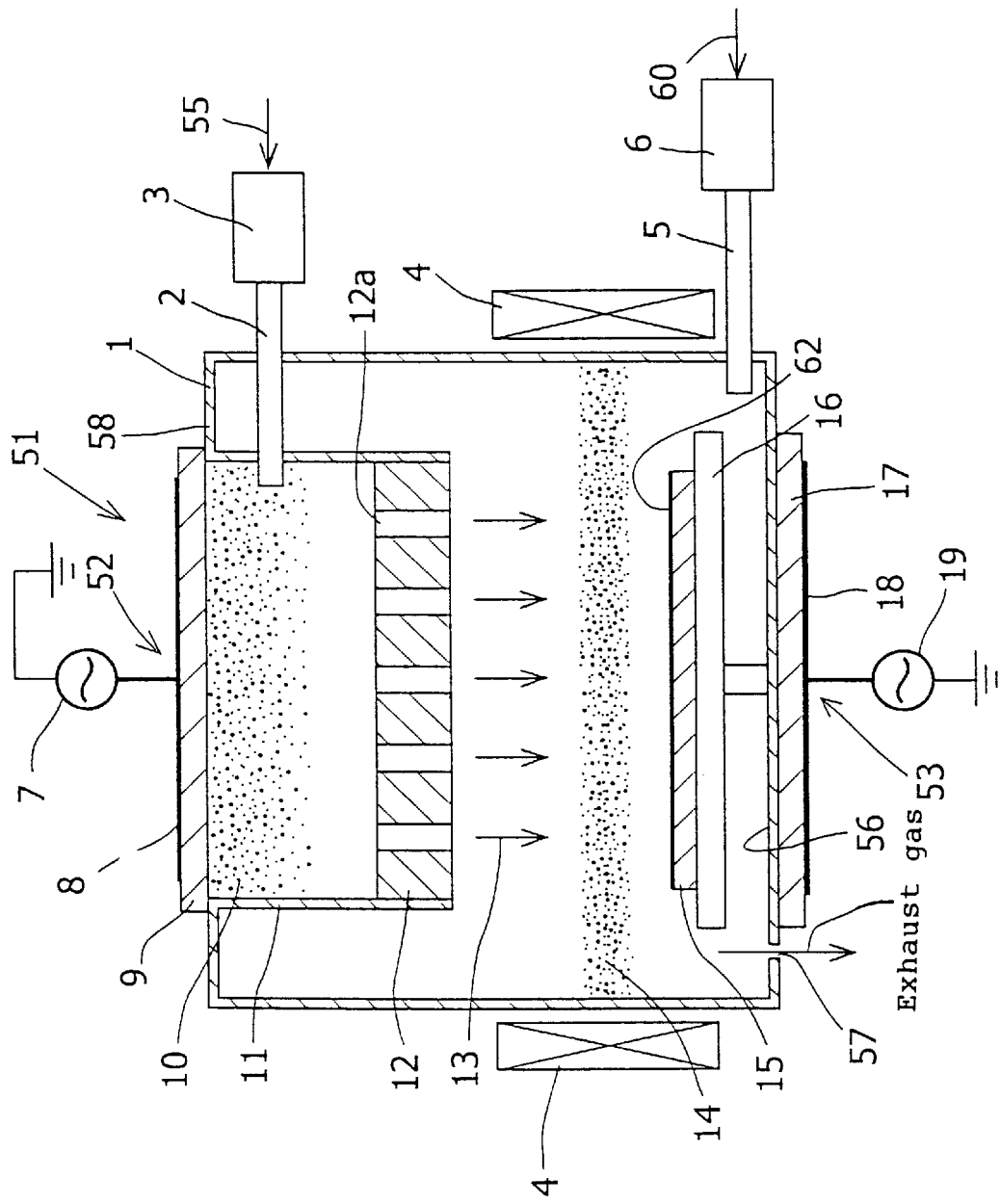
FIG. 1 is a schematic view of a plasma-excited vapor phase growth apparatus for use in a first embodiment of the present invention.

FIG. 1 is a schematic view of a plasma-excited vapor phase growth apparatus for the formation of a thin noble metal film in accordance with a first embodiment of the present invention.

This plasma-excited vapor phase growth apparatus 51 includes a reaction vessel 1 formed into the shape of a box; first and second plasma generators 52,53 disposed on the upper and lower sides of reaction vessel 1; and a rotating magnetic field coil 4, 4 disposed-on the side of reaction vessel 1.

Moreover, an inlet vessel 11 for receiving a raw material gas 55 is disposed in the upper part of the aforesaid reaction vessel 1. A flow controller 3 and a nozzle 2 are connected to the sidewall of inlet vessel 11, and a perforated plate 12 made of Cu and having a plurality of holes 12a bored therethrough is disposed at the bottom thereof. Furthermore, rotating magnetic field coil 4, 4 disposed on the side of reaction vessel 1 creates a rotating magnetic field in the lower part of reaction vessel 1, and this rotating magnetic field causes a metal such as Cu to receive a force directed toward a substrate 15 and thereby travel in an accelerated manner. In the lowermost part of reaction vessel 1, a heater 16 is disposed so as to be spaced from perforated plate 12, and substrate 15 is placed on this heater 16. At the lower end of reaction vessel 1 and below rotating magnetic field coil 4, a reducing gas flow controller 6 and a reducing gas inlet nozzle 5 are disposed in order to feed a reducing gas 60 comprising hydrogen gas into the interior of reaction vessel 1. First plasma generator 52 consists of an insulating plate 9 disposed on the top surface 58 of reaction vessel 1, a first plasma antenna 8 disposed on insulating plate 9, and a first plasma power supply 7. Second plasma generator 53 has the same construction as first plasma generator 52. The bottom wall 56 of reaction vessel 1 has an exhaust port 57 bored therethrough.

Now, the operation of plasma-excited vapor phase growth apparatus 51 having the above-described construction is described below.

First of all, $Cl_2$ gas used as raw material gas 55 is passed through flow controller 3 in order to control its flow rate, and then introduced into inlet vessel 11 through nozzle 2. Subsequently, the raw material gas comprising $Cl_2$ gas is converted into a plasma by means of first plasma antenna 8 which is energized by first plasma power supply 7, so that a raw material gas plasma 10 comprising $Cl_2$ plasma is generated within inlet vessel 11. Since the material of perforated plate 12 contains Cu, this $Cl_2$ plasma actively causes an etching reaction of perforated plate 12 made of Cu, resulting in the production of a precursor ($Cu_xCl_y$) 13. This precursor ($Cu_xCl_y$) 13 is discharged downward through the plurality of holes 12a of perforated plate 12. Thereafter, under the action of the rotating magnetic field created by rotating magnetic field coil 4,4, precursor 13 is accelerated and conveyed toward substrate 15 placed on heater 16. Immediately before precursor 13 arrives at substrate 15, it passes through a reducing gas plasma 14 comprising $H_2$ plasma produced by means of second plasma antenna 18 which is energized by second plasma power supply 19. Thus, the aforesaid precursor 13 undergoes a reduction reaction with atomic hydrogen to form a thin Cu film 62 on substrate 15. The extent to which this thin Cu film 62 is formed depends on the uniformity of the rotating magnetic field.

Alternatively, HCl gas may be used as the aforesaid raw material gas 55. In this case, HCl plasma is produced as raw material gas plasma 10, but precursor 13 produced by an etching reaction of perforated plate 12 made of Cu is $Cu_xCl_y$. Accordingly, raw material gas 55 may comprise any gas containing chlorine, and a mixed gas composed of HCl gas and $Cl_2$ gas may also be used. The extent to which a thin film can be stably formed depends on the uniformity of the rotating magnetic field.

[Second Embodiment]

Figure 2:
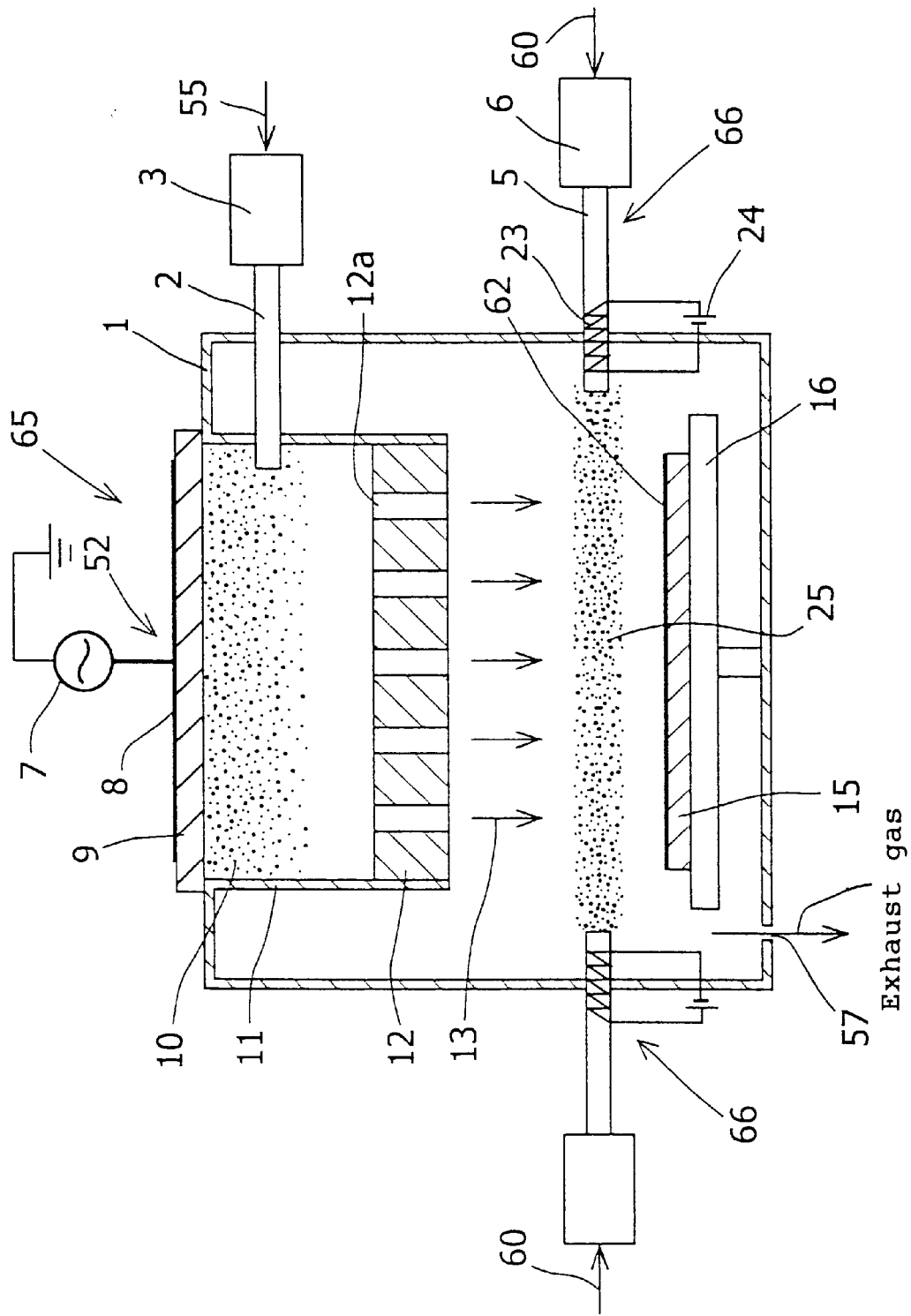
FIG. 2 is a schematic view of a plasma-excited vapor phase growth apparatus for use in a second embodiment of the present invention.

FIG. 2 is a schematic view of a plasma-excited vapor phase growth apparatus 65 for the formation of a thin noble metal film in accordance with a second embodiment of the present invention. Since some components of this apparatus 65 have the same structure as those of plasma-excited vapor phase growth apparatus 51 used in the above-described first embodiment, these components are designated by the same reference numerals and the explanation thereof is omitted.

Plasma-excited vapor phase growth apparatus 65 used in the second embodiment includes a reaction vessel 1 formed into the shape of a box; a first plasma generator 52 disposed on the upper side of reaction vessel 1; and a reducing gas heating device 66 for heating a reducing gas (e.g., hydrogen gas) 55 to produce an atomic gas. When compared with plasma-excited vapor phase growth apparatus 51 used in the above-described first embodiment, this plasma-excited vapor phase growth apparatus 65 differs in having reducing gas heating device 66.

This reducing gas heating device 66 consists of a reducing gas flow controller 6, a reducing gas inlet nozzle 5 attached thereto, and a tungsten filament disposed within reducing gas inlet nozzle 5. The ends of the tungsten filament are connected to a direct-current power supply 24.

The operation of plasma-excited vapor phase growth apparatus 65 having the above-described construction is described below.

First of all, $Cl_2$ gas used as raw material gas 55 is passed through flow controller 3 in order to control its flow rate, and then introduced into inlet vessel 11 through nozzle 2. Thus, the $Cl_2$ gas is converted into a plasma by means of plasma antenna 8 which is energized by plasma power supply 7, so that a raw material gas plasma 10 comprising $Cl_2$ plasma is generated. This $Cl_2$ plasma actively causes an etching reaction of perforated plate 12 made of Cu, resulting in the production of a precursor ($Cu_xCl_y$) 13 within inlet vessel 11. This precursor ($Cu_xCl_y$) 13 is discharged downward through the plurality of holes 12a of perforated plate 12. Immediately before precursor 13 arrives at substrate 15, a reducing gas 60 comprising $H_2$ gas is passed through reducing gas flow controller 6 in order to control its flow rate, tungsten filament 23 is heated to 1,800° C. by means of direct-current power supply 24 to produce an atomic reducing gas 25 comprising atomic hydrogen, and this atomic reducing gas 25 is injected into reaction vessel 1 through reducing gas inlet nozzle 5. Thus, precursor 13 undergoes a reduction reaction with atomic hydrogen to form a thin Cu film 62 on substrate 15.

Alternatively, HCl gas may be used as the aforesaid raw material gas 55. In this case, HCl plasma is produced as raw material gas plasma 10, but precursor 13 produced by an etching reaction of perforated plate 12 made of Cu is $Cu_xCl_y$. Accordingly, raw material gas 55 may comprise any gas containing chlorine, and a mixed gas composed of HCl gas and $Cl_2$ gas may also be used.

Since atomic reducing gas 25 comprising atomic hydrogen can be fed simply by use of reducing gas inlet nozzle 5 which permits a relatively flexible arrangement, a film having an area up to about 50 mm×50 mm can be stably formed.

[Third Embodiment]

Figure 3:
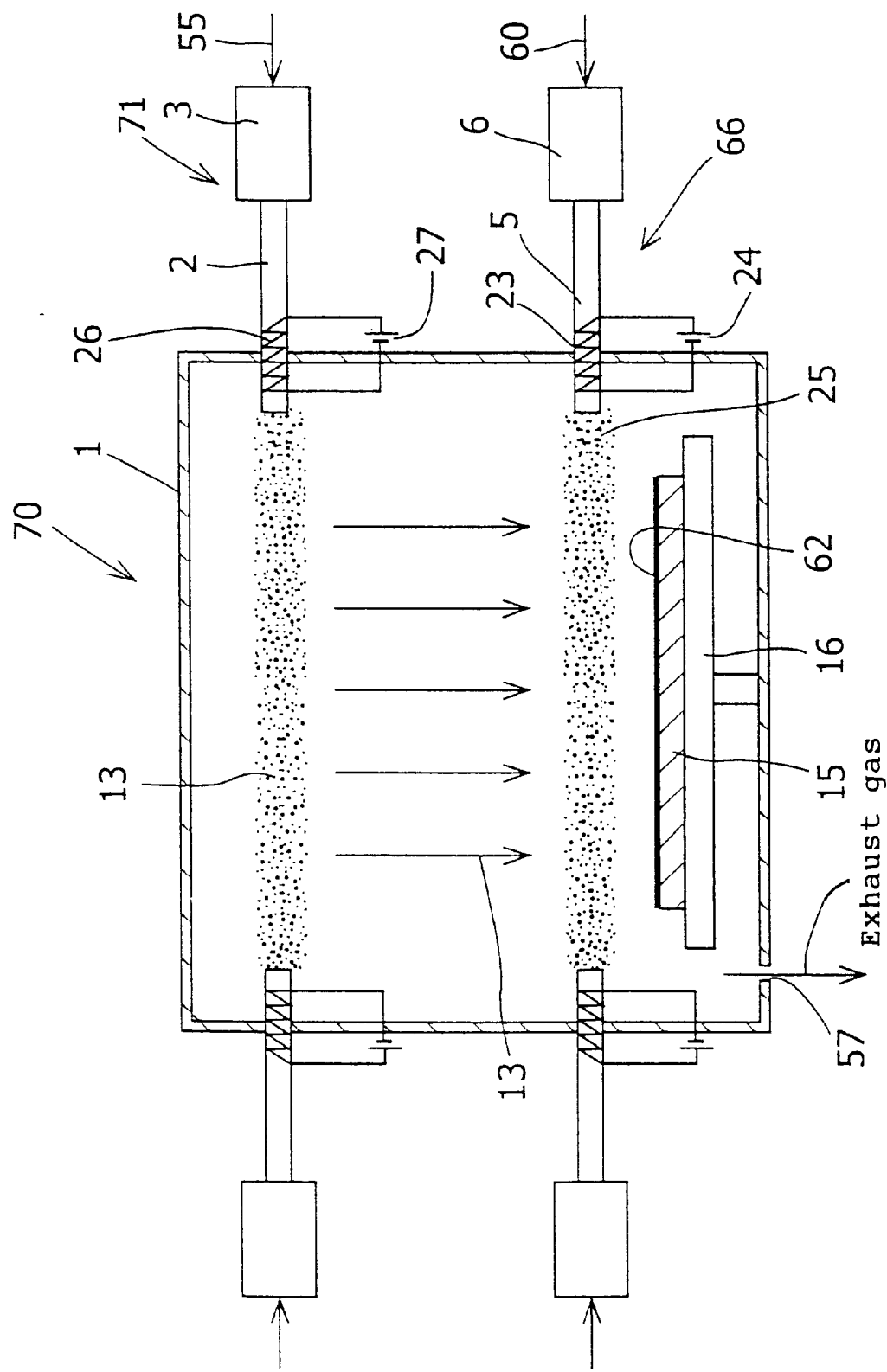
FIG. 3 is a schematic view of a plasma-excited vapor phase growth apparatus for use in a third embodiment of the present invention.

FIG. 3 is a schematic view of a plasma-excited vapor phase growth apparatus 70 for the formation of a thin noble metal film in accordance with a third embodiment of the present invention. Since some components of this apparatus 70 have the same structure as those of plasma-excited vapor phase growth apparatus 51,65 used in the above-described first and second embodiments, these components are designated by the same reference numerals and the explanation thereof is omitted.

Plasma-excited vapor phase growth apparatus 70 used in the third embodiment includes a reaction vessel 1 formed into the shape of a box; a raw material gas heating device 71 disposed in the upper part of reaction vessel 1; and a reducing gas heating device 66 disposed in the upper part of reaction vessel 1. When compared with plasma-excited vapor phase growth apparatus 65 used in the above-described second embodiment, this plasma-excited vapor phase growth apparatus 70 differs in having raw material gas heating device 71.

This raw material gas heating device 71 consists of a flow controller 3, a nozzle 2 attached thereto, and a copper filament comprising several turns of copper wire and disposed within nozzle 2. The ends of copper filament 26 are connected to a direct-current power supply 27.

The operation of plasma-excited vapor phase growth apparatus 70 having the above-described construction is described below.

First of all, $Cl_2$ gas used as raw material gas 55 is passed through flow controller 3 in order to control its flow rate, and then fed into raw material gas inlet nozzle 2. This raw material gas inlet nozzle 2 is provided therein with copper filament 26 which has been heated to 300–600° C. by supplying an electric current from direct-current power supply 27 and passing it therethrough. Thus, the aforesaid $Cl_2$ gas is brought into efficient contact with copper filament 26 to produce a precursor 13. When this precursor 13 is introduced into reaction vessel 1 through raw material gas inlet nozzle 2, precursor 13 moves downward.

Now, a reducing gas 60 comprising $H_2$ gas is passed through reducing gas flow controller 6 in order to control its flow rate, and then fed into reducing gas inlet nozzle 5. This reducing gas inlet nozzle 5 is provided therein with tungsten filament 23. When tungsten filament 23 is heated to about 1,800° C. by supplying an electric current from direct-current power supply 24 and passing it therethrough, an atomic reducing gas 25 comprising atomic hydrogen is produced from reducing gas 60. Immediately before precursor 13 arrives at substrate 15, the atomic hydrogen is injected into reaction vessel 1 through reducing gas inlet nozzle 5. Thus, the aforesaid precursor 13 undergoes a reduction reaction with the atomic hydrogen to form a thin Cu film 62 on substrate 15.

The aforesaid raw material gas 55 may comprise any gas containing chlorine. For example, there may be used HCl gas or a mixed gas composed of HCl gas and $Cl_2$ gas.

Since the above-described method can feed precursor 13 and atomic hydrogen simply by use of gas nozzle 5 which permits a relatively flexible arrangement, a film having an area up to about 100 mm×100 mm can be stably formed.

[Fourth Embodiment]

Figure 4:
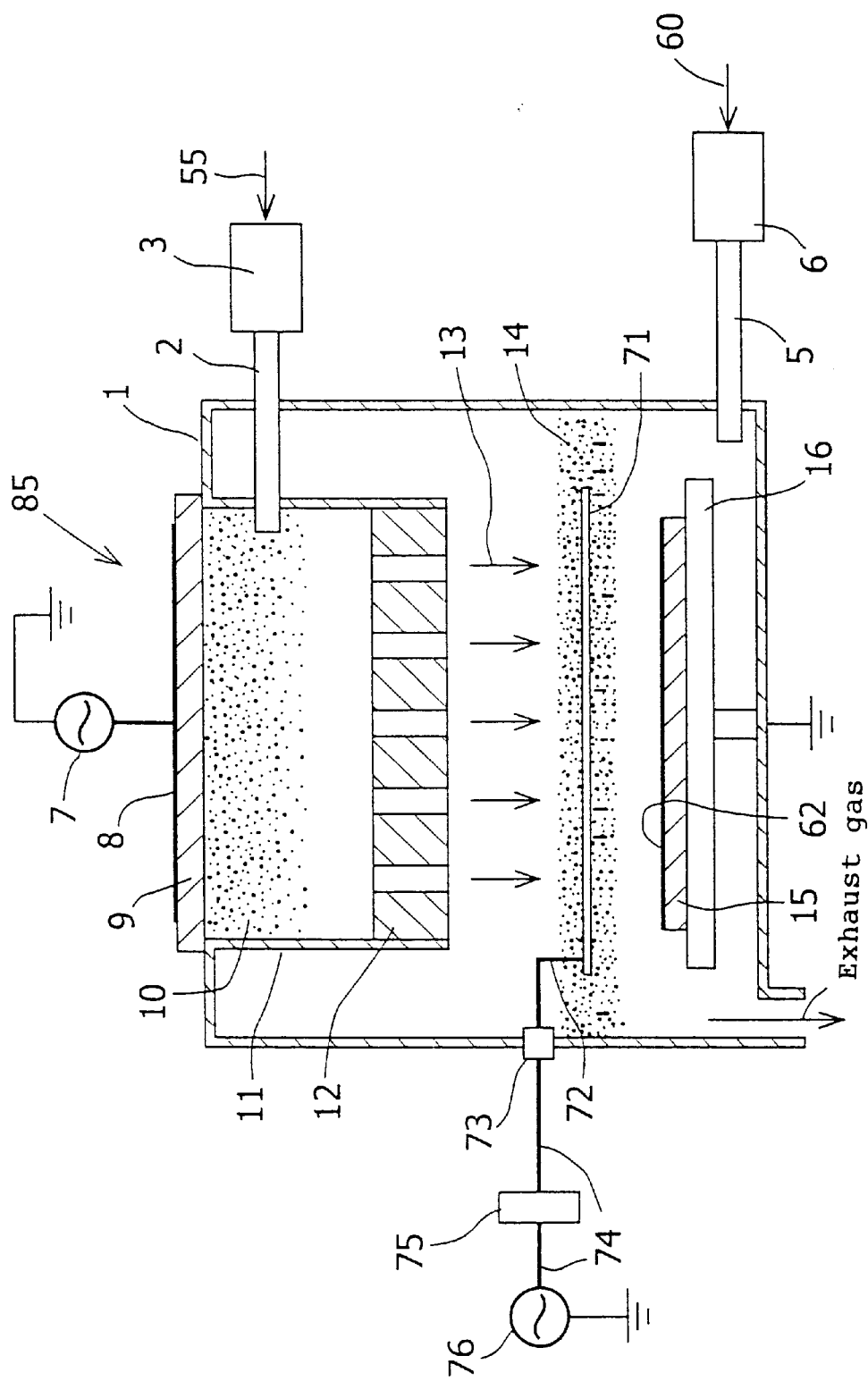
FIG. 4 is a schematic view of a plasma-excited vapor phase growth apparatus for use in a fourth embodiment of the present invention.

FIG. 4 is a schematic view of a plasma-excited vapor phase growth apparatus 85 for the formation of a thin noble metal film in accordance with a fourth embodiment of the present invention. Since some components of this apparatus 85 have the same structure as those of plasma-excited vapor phase growth apparatus 51 used in the above-described first embodiment, these components are designated by the same reference numerals and the explanation thereof is omitted. The aforesaid plasma-excited vapor phase growth apparatus 85 is characterized by the fact that, in plasma-excited vapor phase growth apparatus 51 in accordance with the first embodiment, high-frequency electric power is utilized to generate a reducing plasma. Specifically, this apparatus 85 is constructed by eliminating rotating magnetic field coil 4, insulating plate 17, second plasma antenna 18 and second plasma power supply 19 from the plasma-excited vapor phase growth apparatus 51 of FIG. 1 and instead adding an electrode connected to a high-frequency power supply. No modification is made in the components associated with the production of precursor 13, the feeding of hydrogen gas used as reducing gas 60, and the disposition of substrate 15.

Within reaction vessel 1, the aforesaid plasma-excited vapor phase growth apparatus 85 includes a reducing plasma generating electrode 71 disposed between perforated plate 12 and heater 16. It also includes a high-frequency power supply 76, a matching transformer 75 and an electric current input terminal 73 which are all disposed on the outside of reaction vessel 1. These high-frequency power supply 76, matching transformer 75 and electric current input terminal 73 are connected together by coaxial cables 74, and electric current input terminal 73 and reducing plasma generating electrode 71 are connected together by a feeder 72.

Figure 5:
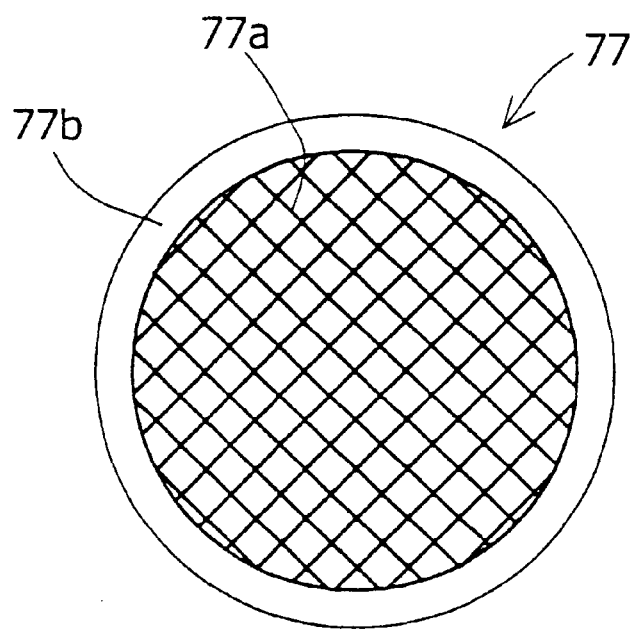
FIG. 5 is a plan view of a meshlike elect rode for use in the fourth embodiment of the present invention.

As the aforesaid reducing plasma generating electrode 71, an electrode in the form of a flat plate having a multitude of holes is used so that the flux of precursor 13 may not be prevented from traveling toward substrate 15. For example, there may be used a circular meshlike electrode 77 as illustrated in FIG. 5. This meshlike electrode 77 consists of a metal mesh 77a formed of woven metal wires and disposed inside, and a mesh-holding jig 77b for fastening the periphery of metal mesh 77a so as to prevent it from being frayed. This mesh-holding jig 77b comprises, for example, an annulus which is made of the same material as that of metal mesh 77a and used to fasten metal mesh 77a by sandwiching it from the upper and lower sides.

It is to be understood that the aforesaid reducing plasma generating electrode 71 is not limited to meshlike electrode 77, but various types of electrodes may be used, provided that they have a shape which does not prevent the flux of precursor 13 from traveling toward substrate 15.

Figure 6:
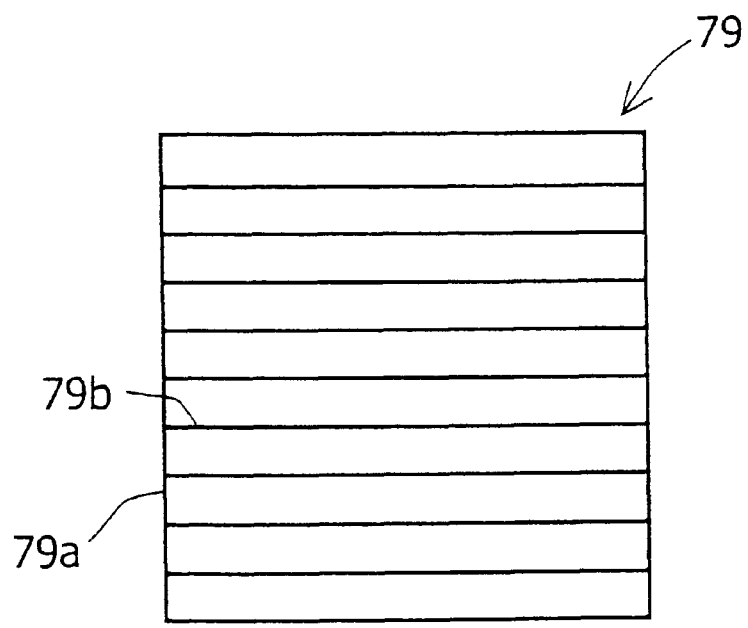
FIG. 6 is a plan view of a ladderlike electrode for use in the fourth embodiment of the present invention.
Figure 7:
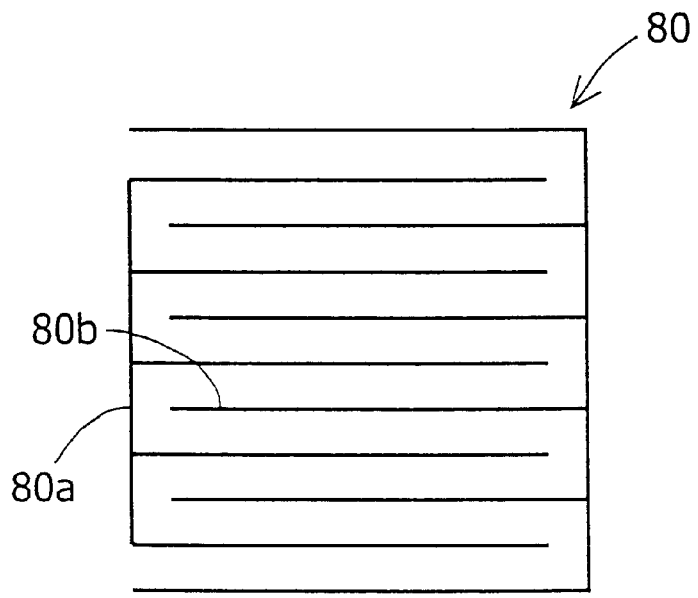
FIG. 7 is a plan view of a comblike electrode for use in the fourth embodiment of the present invention.
Figure 8:
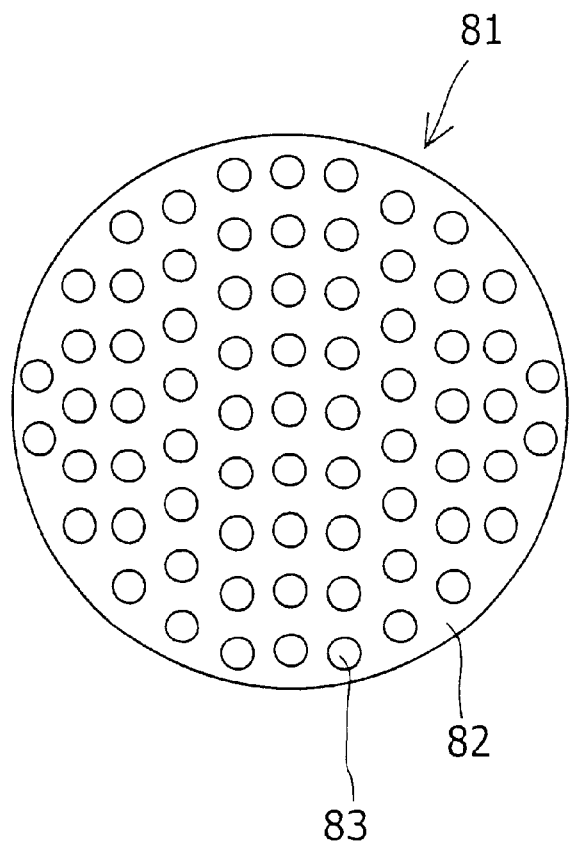
FIG. 8 is a plan view of a punching board type electrode for use in the fourth embodiment of the present invention.

For example, a ladderlike electrode 79 as illustrated in FIG. 6, a comblike electrode 80 as illustrated in FIG. 7, and a punching board type electrode 81 may preferably be used.

The aforesaid ladderlike electrode 79 is formed by arranging a pair of vertical wires 79a in parallel and disposing a plurality of horizontal wires 79b between vertical wires 79a,79a. The aforesaid comblike electrode 80 is formed by providing two units each consisting of one vertical wire 80a having a plurality of horizontal wires 80b attached thereto, and arranging these two units in interdigitated relationship. The aforesaid punching board type electrode 81 is formed by boring a plurality of small holes 83 in a circular metallic board 82.

In the above-described electrodes, no particular limitation is placed on the diameter and number of wires constituting metal mesh 77a, and the pitch of the mesh, in meshlike electrode 77; the diameter, number and spacing of horizontal wires in ladderlike electrode 79; the diameter, number and spacing of vertical and horizontal wires 80a,80b, and the number of units, in comblike electrode 80; the diameter, number and arrangement of holes bored in board 82 constituting punching board type electrode 81; and the degree of opening of the electrode. Accordingly, the shape of the electrode may be suitably chosen according to the type of the desired reducing action.

An electrically conductive material is used for these electrodes. However, the reaction vessel has an atmosphere of chlorine, it is desirable to use stainless steel or the like for the purpose of preventing corrosion.

The operation of the above-described plasma-excited vapor phase growth apparatus 85 is described below.

The process occurring until precursor 13 is discharged through the holes 12a of perforated plate 12 is the same as described in connection with the first embodiment. Then, high-frequency power supply 76 applies high-frequency electric power to reducing plasma generating electrode 71 by way of matching transformer 75 and electric current input terminal 73. Thus, a reducing gas plasma 14 comprising hydrogen plasma is generated over the entire surface of the aforesaid reducing plasma generating electrode 71. When precursor 13 passes through the hydrogen plasma, it undergoes a reduction reaction with atomic hydrogen to form a thin Cu film 62 on substrate 15.

[Fifth Embodiment]

Figure 9:
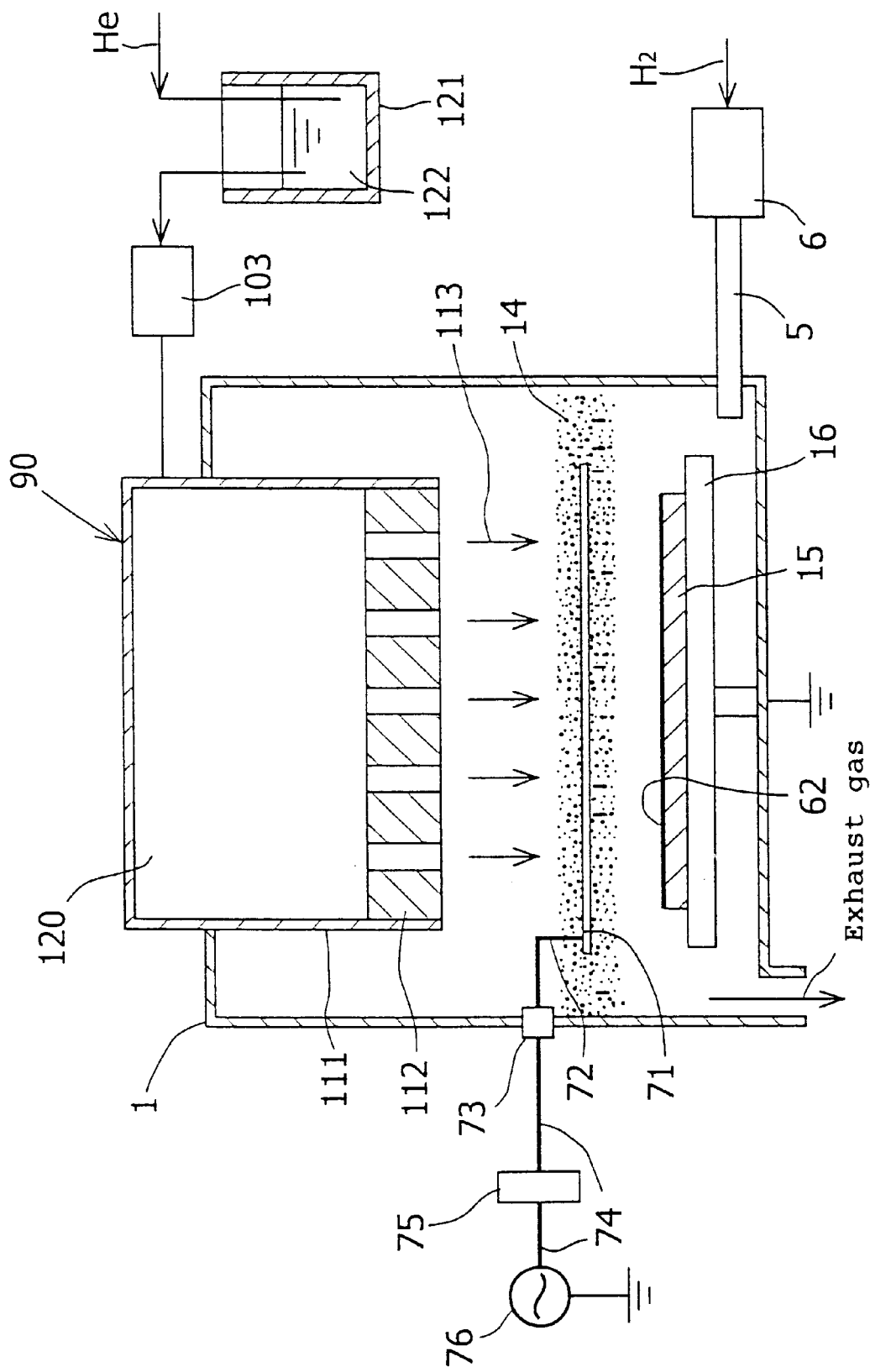
FIG. 9 is a schematic view of a plasma-excited vapor phase growth apparatus for use in a fifth embodiment of the present invention.

FIG. 9 is a schematic view of a plasma-excited vapor phase growth apparatus 90 for the formation of a thin noble metal film in accordance with a fifth embodiment of the present invention. This apparatus 90 is based on the combination of plasma-excited vapor phase growth apparatus 85 used in the above-described fourth embodiment (see FIG. 4) with a convention method for feeding a raw material gas (see FIG. 10). The components having the same structure are designated by the same reference numerals and the explanation thereof is omitted.

In the aforesaid plasma-excited vapor phase growth apparatus 90, a raw material vessel 121 is connected to a vaporizer 120 via a flow controller 103. Moreover, the aforesaid raw material vessel 121 is provided with a bubbling pipe for producing a vapor of liquid raw material 122 contained therein. Further more, this apparatus 90 is equipped with a device for utilizing high-frequency electric power to generate a reducing gas plasma 14 and thereby subjecting precursor 13 to a reduction reaction, as illustrated in FIG. 4.

The operation of plasma-excited vapor phase growth apparatus 90 having the above-described construction is described below.

First of all, a liquid raw material 122 comprising, for example, copper hexafluoroacetylacetonato-trimethylvinylsilane [Cu(hfac)(tmvs)] is contained in raw material vessel 121 and a carrier gas comprising He is bubbled therethrough. Liquid raw material 122 is not limited thereto, but may comprise any desired liquid organometallic complex. The raw material evaporated by bubbling is passed through flow controller 103 to control its flow rate, and then fed into vaporizer 120. After the aforesaid raw material is completely vaporized in vaporizer 120, the resulting precursor 113 is introduced into the interior of reaction vessel 1 through perforated plate 112. Now, similarly to the fourth embodiment, a reducing gas plasma 14 comprising hydrogen plasma is generated by means of high-frequency electric power. Consequently, when the aforesaid precursor 113 passes through the hydrogen plasma, precursor 113 undergoes a reduction reaction to form a thin Cu film 62 on substrate 15.

Figure 10:
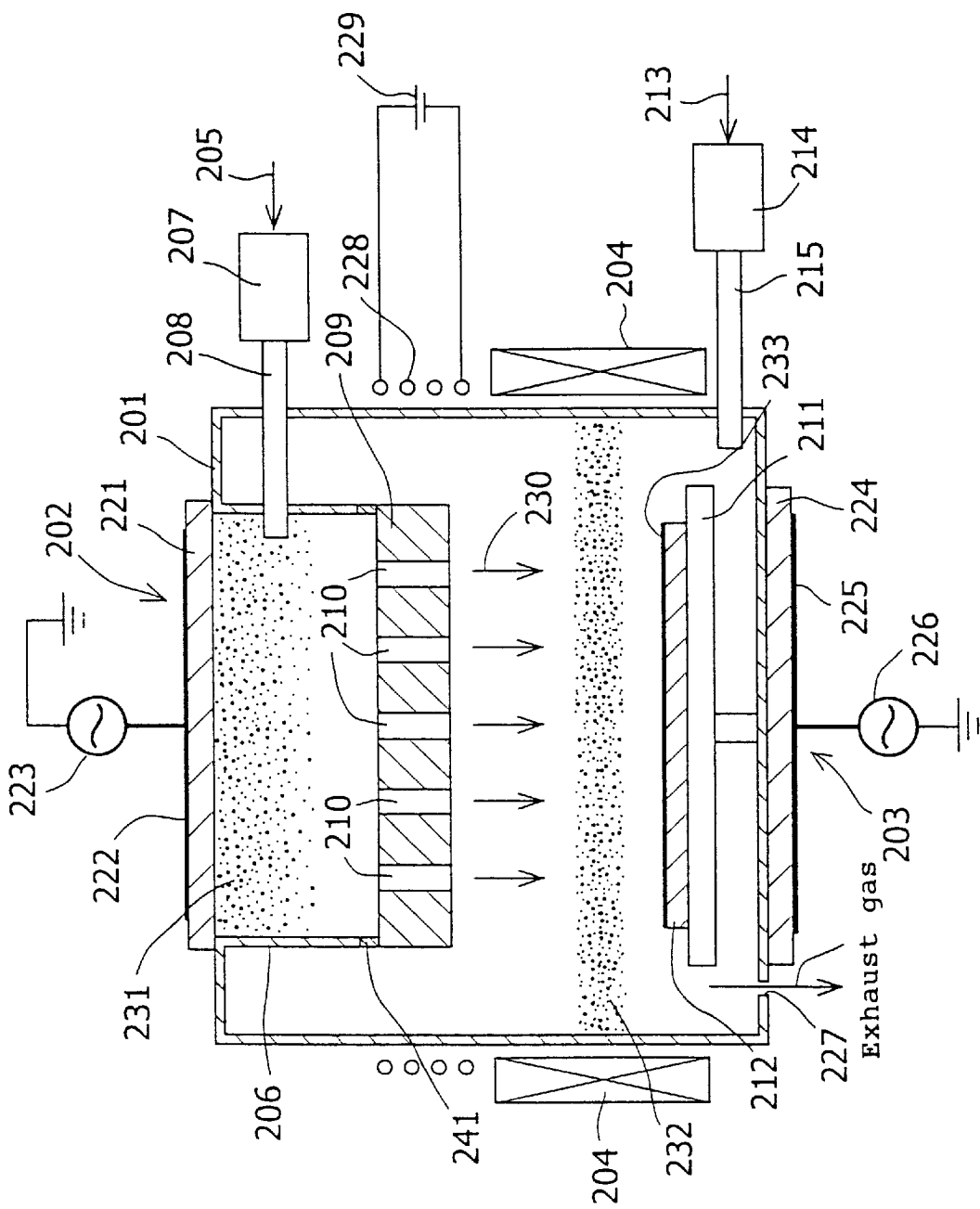
FIG. 10 is a schematic side view of an apparatus for the formation of a metal film in accordance with a sixth embodiment of the present invention.

Next, an apparatus and method for the formation of a metal film in accordance with a sixth embodiment of the present invention is described with reference to FIG. 10. FIG. 10 is a schematic side view of the apparatus for the formation of a metal film in accordance with the sixth embodiment of the present invention.

As illustrated in FIG. 10, this apparatus includes a chamber 201 made, for example, of stainless steel and formed into the shape of a box; a first plasma generating means 202 disposed on the upper side of chamber 201; and a second plasma generating means 203 disposed on the lower side of chamber 201. This apparatus also includes a magnetic field coil 204 disposed on the side of chamber 201. First plasma generating means 202 consists of a first insulating plate 221 disposed on the top surface of chamber 201, a first plasma antenna 222 disposed on first insulating plate 221, and a first power supply 223 for energizing first plasma antenna 222. Second plasma generating means 203 consists of a second insulating plate 224 disposed on the bottom surface of chamber 201, a second plasma antenna 225 disposed on second insulating plate 225, and a second power supply 226 for energizing second plasma antenna 225.

Within chamber 201, an inlet vessel 206 is disposed under first insulating plate 221, and a raw material gas 205 comprising chlorine gas ($Cl_2$ gas) is fed into inlet vessel 206. A flow controller 207 and a nozzle 208 are connected to the sidewall of inlet vessel 206, and a discharge plate (or metallic plate) 209 made of Copper (Cu) is disposed at the bottom of inlet vessel 206. This discharge plate 209 has a multitude of discharge orifices 210 bored therethrough. A support 211 is disposed near the bottom of chamber 201 and a substrate 212 is placed on this support 211. Support 211 is heated to a predetermined temperature by a heater means (not shown). At the lower end of chamber 201 and below magnetic field coil 204, a reducing gas flow controller 214 and a reducing gas nozzle 215 are disposed in order to feed a reducing gas 213 comprising hydrogen gas ($H_2$ gas) into the interior of chamber 201. Furthermore, the bottom wall of chamber 201 has an exhaust port 227 bored therethrough.

On the other hand, the sidewall of chamber 201 is provided with a filament type heater 228 serving as a chamber heating means. By using a power supply 229 to energize this heater 228, the sidewall of chamber 201 is heated to a predetermined temperature, for example, in the range of 200 to 600° C. It is preferable that the upper limit of the predetermined temperature is not higher than the durable temperature of chamber 201. Since this embodiment is described in connection with chamber 201 made of stainless steel, the upper temperature limit is set at 600° C. Thus, the upper limit of the predetermined temperature may be suitably determined according to the material of chamber 201.

Even if the precursor ($Cu_xCl_y$) which will be described later adheres to the sidewall of chamber 201, it will readily be vaporized because the sidewall of chamber 201 is heated to cause a rise in the vapor pressure of the precursor. Consequently, the precursor ($Cu_xCl_y$) is prevented from depositing on the sidewall of chamber 201. Since this embodiment is described in connection with discharge plate 209 made of Cu, the lower limit of the predetermined temperature is set at 200° C. Thus, the lower limit of the predetermined temperature may be suitably determined according to the type of the precursor produced on the basis of the material of discharge plate 209.

In the above-described apparatus for the formation of a metal film, $Cl_2$ gas is fed into inlet vessel 206. When electromagnetic waves are radiated into inlet vessel 206 by first plasma antenna 222 of first plasma generating means 202, the $Cl_2$ gas within inlet vessel 206 is ionized to generate $Cl_2$ gas plasma (raw material gas plasma) 231. This $Cl_2$ gas plasma 231 causes an etching reaction of discharge plate 209 made of Cu, so that a precursor ($Cu_xCl_y$) 230 is produced. This precursor ($Cu_xCl_y$) 230 is discharged downward through discharge orifices 210.

On the other hand, $H_2$ gas is introduced into chamber 201. When electromagnetic waves are radiated into chamber 201 by second plasma antenna 225 of second plasma generating means 203, the $H_2$ gas within chamber 201 is ionized to generate $H_2$ gas plasma (reducing gas plasma) 232. Owing to a rotating magnetic field created by magnetic field coil 204, this $H_2$ gas plasma 232 is densely and uniformly distributed in the neighborhood of the surface of substrate 212.

Immediately before precursor ($Cu_xCl_y$) 230 discharged downward through discharge orifices 210 arrives at substrate 212, it passes through $H_2$ gas plasma 232. While precursor ($Cu_xCl_y$) 230 passes through $H_2$ gas plasma 232 serving as a reducing gas plasma, chlorine is removed therefrom by a reduction reaction with atomic hydrogen. The resulting Cu ions are directed onto substrate 212 to form a thin Cu film 233 on the surface of substrate 212.

Since the sidewall of chamber 201 is heated to a predetermined temperature (e.g., 200° C.) by heater 228, precursor ($Cu_xCl_y$) 230 adhering to the sidewall of chamber 201 will readily be vaporized because of its raised vapor pressure. Consequently, precursor ($Cu_xCl_y$) 230 is prevented from depositing on the sidewall of chamber 201. It has been confirmed that, if the sidewall of chamber 201 has a temperature lower than the predetermined temperature (e.g., 180° C. or so), the vapor pressure of precursor ($Cu_xCl_y$) 230 will not rise sufficiently and, therefore, precursor ($Cu_xCl_y$) 230 will deposit on the sidewall of chamber 201.

In the above-described apparatus for the formation of a metal film, chlorine gas ($Cl_2$ gas) is used as an example of raw material gas 205. However, HCl gas may also be used. In this case, HCl gas plasma is generated as the raw material gas plasma, but precursor 230 produced by the etching of discharge plate 209 made of Cu is $Cu_xCl_y$. Accordingly, raw material gas 205 may comprise any gas containing chlorine, and a mixed gas composed of HCl gas and $Cl_2$ gas may also be used. Moreover, the material of discharge plate 209 is not limited to Cu, but Ag, Au, Pt, Ti, W and the like may also be used. In this case, precursor 230 comprises a chloride of Ag, Au, Pt, Ti, W or the like, and the thin film formed on the surface of substrate 212 comprises Ag, Au, Pt, Ti, W or the like.

Since two plasmas, namely $Cl_2$ gas plasma (raw material gas plasma) 231 and $H_2$ gas plasma (reducing gas plasma) 232, are used in the above-described apparatus for the formation of a metal film, the reaction efficiency is markedly improved to cause an increase in rate of film growth. Moreover, since chlorine gas ($Cl_2$ gas) is used as raw material gas 205 and a hydrogen-containing gas is used as reducing gas 213, a marked reduction in cost is achieved. Furthermore, since the reduction reaction can be accelerated independently, the amount of impurities (e.g., chlorine) remaining in thin Cu film 233 can be minimized to form a thin Cu film 233 of high quality.

In addition, since the sidewall of chamber 201 is heated to a predetermined temperature by heater 228, precursor ($Cu_xCl_y$) 230 adhering to the sidewall of chamber 201 will readily be vaporized because of its raised vapor pressure. Thus, precursor ($Cu_xCl_y$) 230 is prevented from depositing on the sidewall of chamber 201. Consequently, the necessity of cleaning the inside of chamber 201 periodically can be eliminated to cause an improvement in raw material efficiency and a reduction in running cost.

Figure 11:
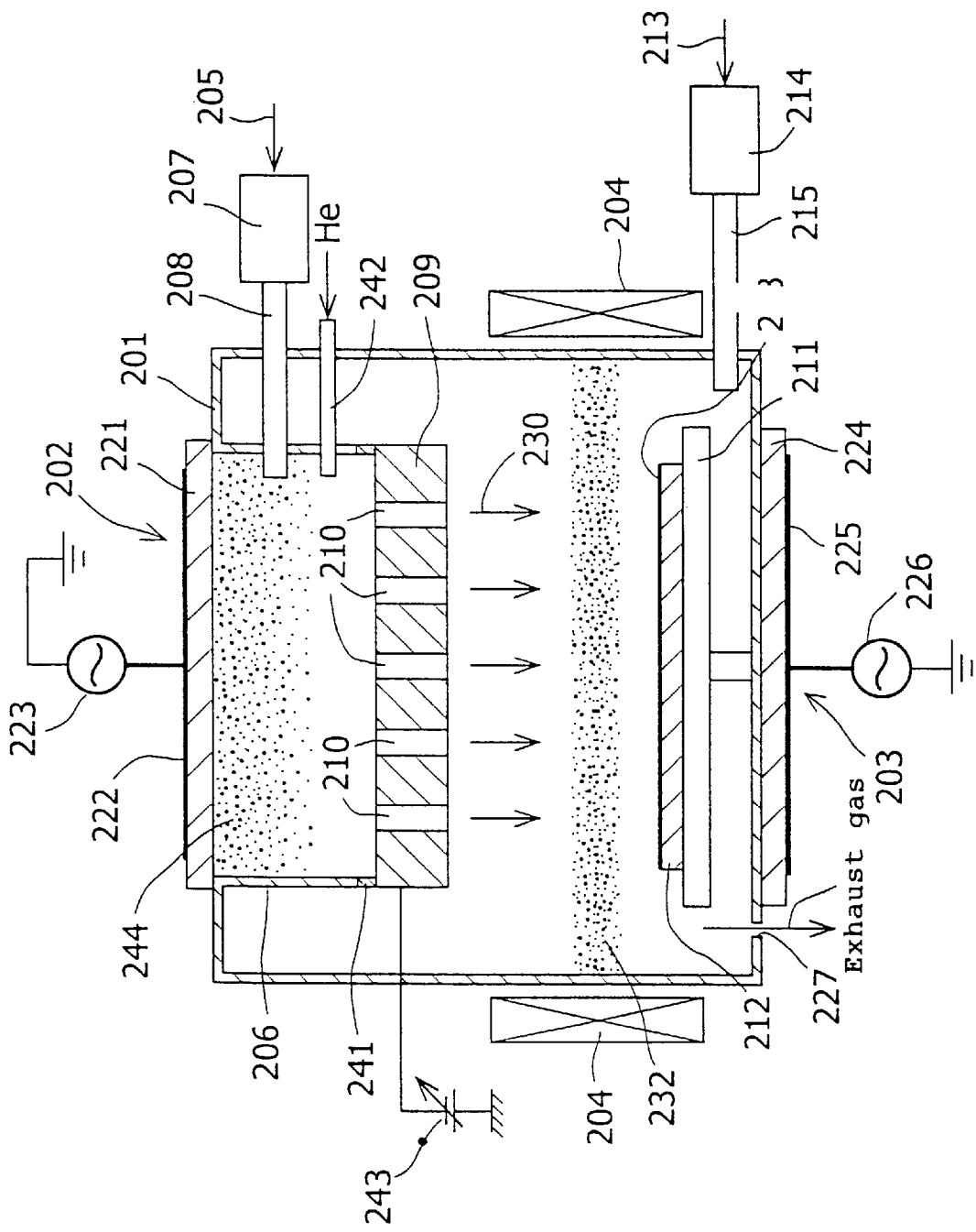
FIG. 11 is a schematic side view of an apparatus for the formation of a metal film in accordance with a seventh embodiment of the present invention.

Now, an apparatus and method for the formation of a metal film in accordance with a seventh embodiment of the present invention is described with reference to FIG. 11. FIG. 11 is a schematic side view of the apparatus for the formation of a metal film in accordance with the seventh embodiment of the present invention. The same components as those shown in FIG. 10 are designated by the same reference numerals and the duplicate explanation thereof is omitted.

When compared with the apparatus for the formation of a metal film as illustrated in FIG. 10, the apparatus for the formation of a metal film in accordance with the seventh embodiment as illustrated in FIG. 11 does not include the chamber heating means comprising filament type heater 228 and power supply 229, but includes a discharge plate heating means for heating discharge plate 209. Specifically, discharge plate (or metallic plate) 209 made of Copper (Cu) is provided at the bottom of inlet vessel 206 through the medium of an insulating member 241. An auxiliary nozzle 242 for feeding a rare gas comprising He gas is connected to the sidewall of inlet vessel 206. Thus, He gas is fed into inlet vessel 206 together with raw material gas 205 comprising chlorine gas ($Cl_2$ gas). $Cl_2$ gas and He gas are fed into inlet vessel 206 in a ratio of approximately 1:1. A biasing power supply 243 is connected to discharge plate 209, so that a direct-current voltage is applied to discharge plate 209 by biasing power supply 243.

In the above-described apparatus for the formation of a metal film, when electromagnetic waves are radiated into inlet vessel 206 by first plasma antenna 222 of first plasma generating means 202, the $Cl_2$ gas and He gas within inlet vessel 206 are ionized to generate $Cl_2$—He gas plasma 244. This $Cl_2$—He gas plasma 244 causes He ions to collide with discharge plate 209 to which a bias voltage is applied. Thus, discharge plate 209 is uniformly heated. As the means for heating discharge plate 209, a heater or other means for heating discharge plate 209 directly may also be used in place of the means based on the collision of He ions.

The heating temperature of discharge plate 209 is, for example, in the range of 200 to 800° C. and preferably 600° C. It is preferable that the lower limit of the heating temperature is a temperature at which precursor ($Cu_xCl_y$) 230 passing through discharge orifices 210 becomes a monomeric compound rather than a polymeric one. When discharge plate 209 is heated to 600° C., precursor 230 tends to be monomeric CuCl and this facilitates the reduction reaction which will be described later. The upper limit of the heating temperature depends on the material of discharge plate 209. In the case of discharge plate 209 made of copper (Cu), the upper limit is 800° C. If the heating temperature exceeds 800° C., discharge plate 209 cannot be used because of its softening. Discharge plate 209 can be adjusted to a desired temperature by controlling the voltage applied to discharge plate 209.

When $Cl_2$—He gas plasma 244 is generated within inlet vessel 206, the $Cl_2$ gas plasma causes an etching reaction of the heated discharge plate 209 made of Cu, so that a monomeric precursor (CuCl) 230 tends to be produced. The resulting precursor (CuCl) 230 is discharged downward through discharge orifices 210 of discharge plate 209. Immediately before precursor (CuCl) 230 discharged downward through discharge orifices 210 arrives at substrate 212, it passes through $H_2$ gas plasma 232. Thus, chlorine is removed therefrom by a reduction reaction with atomic hydrogen. The resulting Cu ions are directed onto substrate 212 to form a thin Cu film 233 on the surface of substrate 212.

Since precursor 230 discharged downward comprises monomeric CuCl, it can readily be reduced by atomic hydrogen. Thus, chlorine is removed therefrom by reduction in a short period of time. Consequently, the resulting Cu ions are directed onto substrate 212 to form a thin Cu film 233 on the surface of substrate 212 in a short period of time. That is, since discharge plate 209 is uniformly heated to a desired temperature by the collision of He ions, a monomeric precursor (CuCl) 230 which can readily be reduced is produced. This makes it possible to remove chlorine by reduction in a short period of time and thereby improve the rate of film growth.

Figure 12:
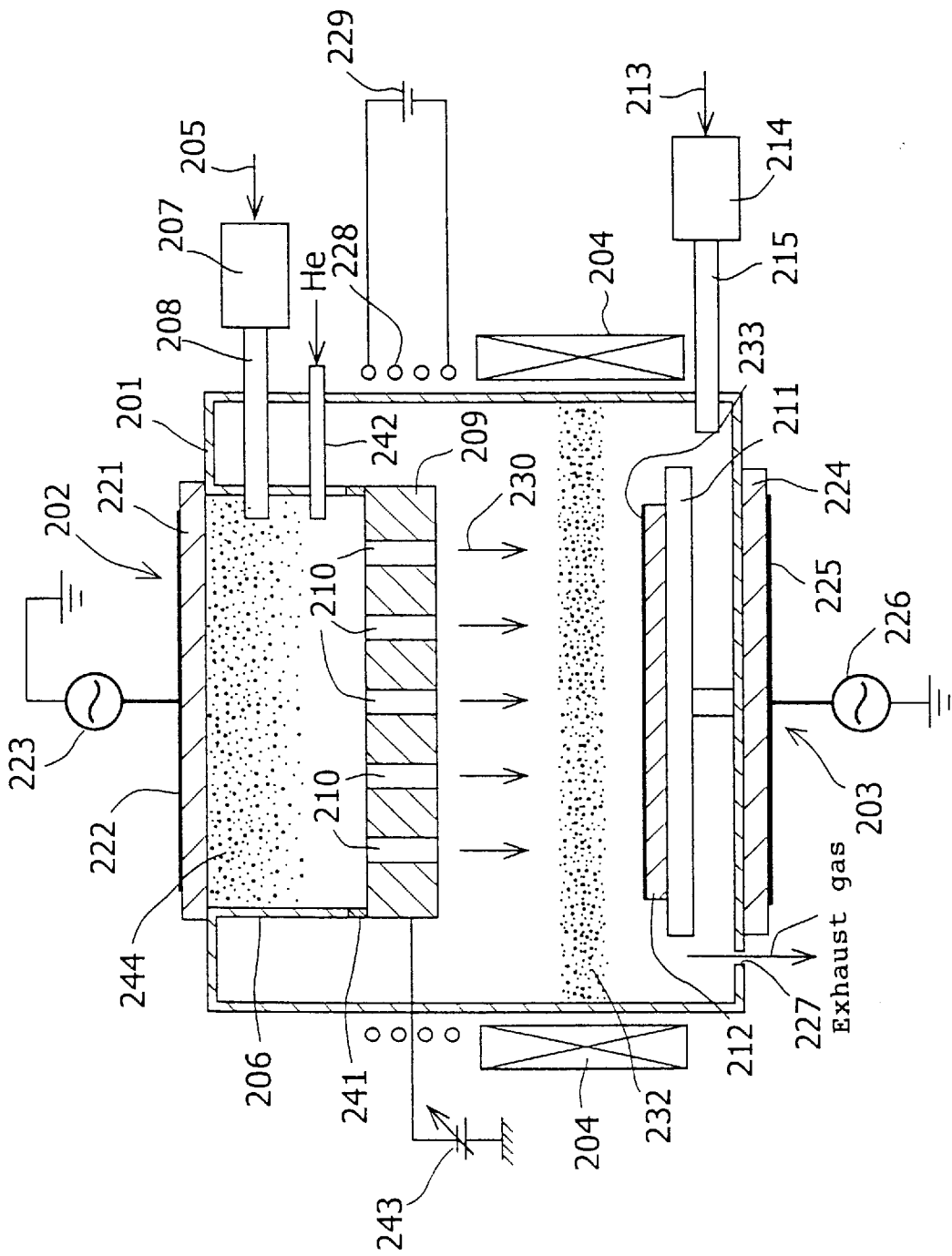
FIG. 12 is a schematic side view of an apparatus for the formation of a metal film in accordance with an eighth embodiment of the present invention.

Now, an apparatus and method for the formation of a metal film in accordance with an eighth embodiment of the present invention is described with reference to FIG. 12. FIG. 12 is a schematic side view of the apparatus for the formation of a metal film in accordance with the eighth embodiment of the present invention. The same components as those shown in FIGS. 10 and 11 are designated by the same reference numerals and the duplicate explanation thereof is omitted.

When compared with the apparatus for the formation of a metal film as illustrated in FIG. 11, the apparatus for the formation of a metal film in accordance with the eighth embodiment as illustrated in FIG. 12 includes a chamber heating means comprising a filament type heater 228 and a power supply 229. That is, this apparatus is equipped with both the chamber heating means and the discharge plate heating means.

Thus, since the sidewall of chamber 201 is heated to a predetermined temperature (e.g., 200° C.) by heater 228, precursor (CuCl) 230 adhering to the sidewall of chamber 201 will readily be vaporized because of its raised vapor pressure. Consequently, precursor (CuCl) 230 is prevented from depositing on the sidewall of chamber 201. Moreover, since precursor 230 discharged downward comprises monomeric CuCl, it can readily be reduced by atomic hydrogen. Thus, chlorine is removed therefrom by reduction in a short period of time. Consequently, the resulting Cu ions are directed onto substrate 212 to form a thin Cu film 233 on the surface of substrate 212 in a short period of time.

Accordingly, since the sidewall of chamber 201 is heated to a predetermined temperature by heater 228, precursor (CuCl) 230 adhering to the sidewall of chamber 201 will readily be vaporized because of its raised vapor pressure. Thus, precursor (CuCl) 230 is prevented from depositing on the sidewall of chamber 201. Consequently, the necessity of cleaning the inside of chamber 201 periodically can be eliminated to cause an improvement in raw material efficiency and a reduction in running cost. Moreover, since discharge plate 209 is uniformly heated to a desired temperature by the collision of He ions, a monomeric precursor (CuCl) 230 which can readily be reduced is produced. This makes it possible to remove chlorine by reduction in a short period of time and thereby improve the rate of film growth.

Figure 13:
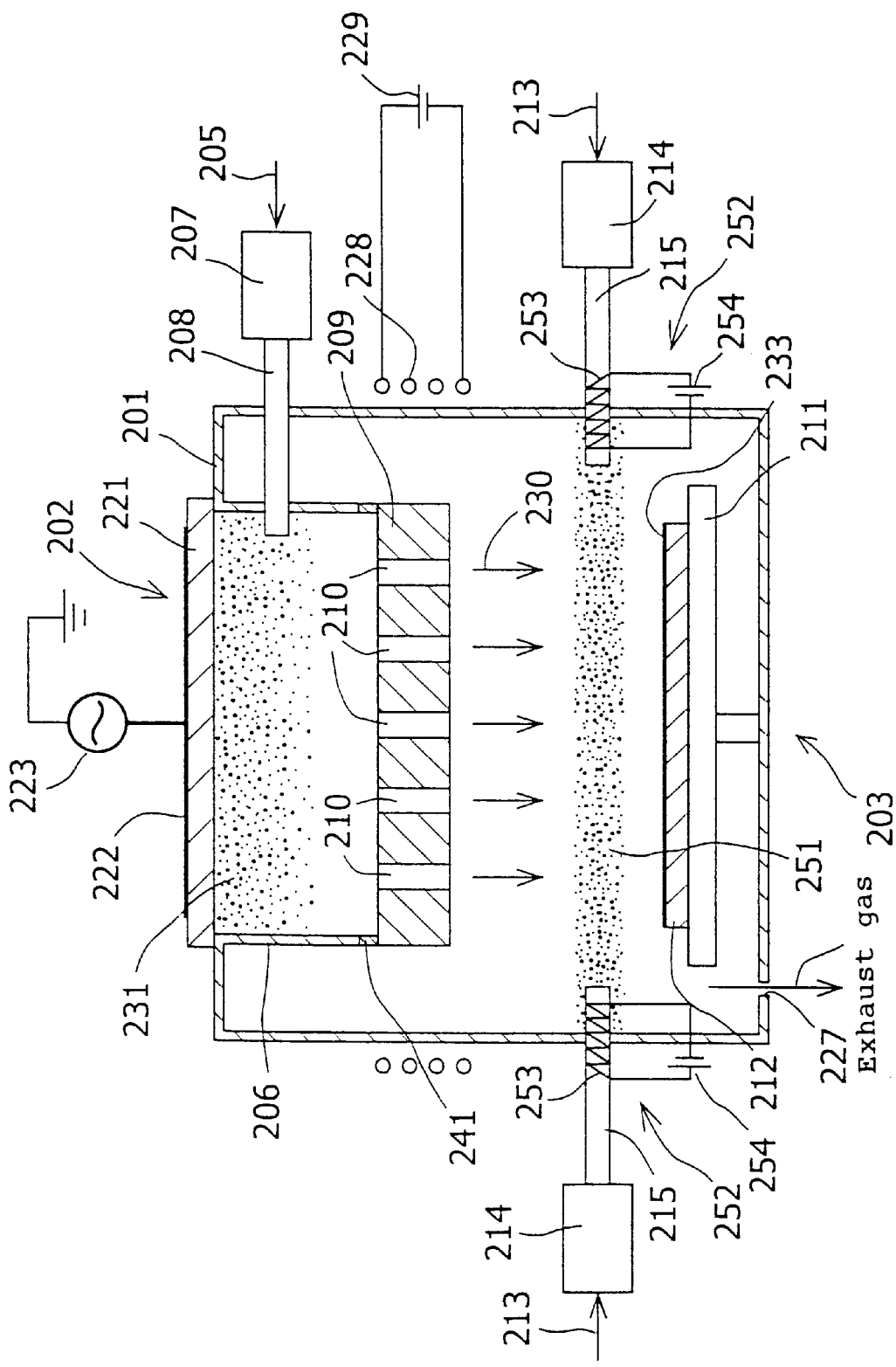
FIG. 13 is a schematic side view of an apparatus for the formation of a metal film in accordance with a ninth embodiment of the present invention.

Now, an apparatus and method for the formation of a metal film in accordance with a ninth embodiment of the present invention is described with reference to FIG. 13. FIG. 13 is a schematic side view of the apparatus for the formation of a metal film in accordance with the ninth embodiment of the present invention. The same components as those shown in FIG. 10 are designated by the same reference numerals and the duplicate explanation thereof is omitted.

When compared with the apparatus for the formation of a metal film as illustrated in FIG. 10, the apparatus for the formation of a metal film in accordance with the ninth embodiment as illustrated in FIG. 13 is characterized in that an atomic reducing gas 251 id produced in place of the reducing gas plasma comprising $H_2$ gas plasma 232. To this end, this apparatus includes a reducing gas heating means 252 for heating a reducing gas (e.g., $H_2$ gas) 213 to produce an atomic reducing gas 251, in place of second plasma generating means 203. This reducing gas heating means 252 consists of a reducing gas flow controller 214, a reducing gas nozzle 215 attached thereto, and tungsten filament 253 disposed within reducing gas nozzle 215. The ends of tungsten filament 215 are connected to a direct-current power supply 254.

In the above-described apparatus for the formation of a metal film, $Cl_2$ gas is fed into inlet vessel 206. When electromagnetic waves are radiated into inlet vessel 206 by first plasma antenna 222 of first plasma generating means 202, the $Cl_2$ gas within inlet vessel 206 is ionized to generate $Cl_2$ gas plasma (raw material gas plasma) 231. This $Cl_2$ gas plasma 231 causes an etching reaction of discharge plate 209 made of Cu, so that a precursor $(Cu_xCl_y)$ 230 is produced. This precursor $(Cu_xCl_y)$ 230 is discharged downward through discharge orifices 210.

Immediately before precursor $(Cu_xCl_y)$ 230 arrives at substrate 212, a reducing gas 213 comprising $H_2$ gas is passed through reducing gas flow controllers 214 in order to control its flow rate, and tungsten filament 253 is heated to 1,800° C. by means of direct-current power supply 254. As a result of the hearing of tungsten filament 253, an atomic reducing gas 251 (atomic hydrogen) is produced and injected into chamber 201 through reducing gas inlet nozzle 215. Consequently, precursor $(Cu_xCl_y)$ 230 discharged downward through discharge orifices 210 passes through atomic reducing gas 251 immediately before arriving at substrate 212. Thus, chlorine is removed from precursor $(Cu_xCl_y)$ 230 by a reduction reaction with atomic hydrogen. The resulting Cu ions are directed onto substrate 212 to form a thin Cu film 233 on the surface of substrate 212.

Since the sidewall of chamber 201 is heated to a predetermined temperature (e.g., 200° C.) by heater 228, precursor $(Cu_xCl_y)$ 230 adhering to the sidewall of chamber 201 will readily be vaporized because of its raised vapor pressure. Consequently, precursor $(Cu_xCl_y)$ 230 is prevented from depositing on the sidewall of chamber 201.

In the above-described apparatus for the formation of a metal film, since chlorine gas ($Cl_2$ gas) is used as raw material gas 205 and a hydrogen-containing gas is used as reducing gas 213, a marked reduction in cost is achieved. Moreover, since the reduction reaction can be accelerated independently, the amount of impurities (e.g., chlorine) remaining in thin Cu film 233 can be minimized to form a thin Cu film 233 of high quality. Furthermore, since atomic reducing gas 251 comprising atomic hydrogen can be fed simply by use of reducing gas nozzle 215 which permits a relatively flexible arrangement, a film having a large area (e.g., 50 mm×50 mm) can be stably formed.

In addition, since the sidewall of chamber 201 is heated to a predetermined temperature by heater 228, precursor $(Cu_xCl_y)$ 230 adhering to the sidewall of chamber 201 will readily be vaporized because of its raised vapor pressure. Thus, precursor $(Cu_xCl_y)$ 230 is prevented from depositing on the sidewall of chamber 201. Consequently, the necessity of cleaning the inside of chamber 201 periodically can be eliminated to cause an improvement in raw material efficiency and a reduction in running cost.

Figure 14:
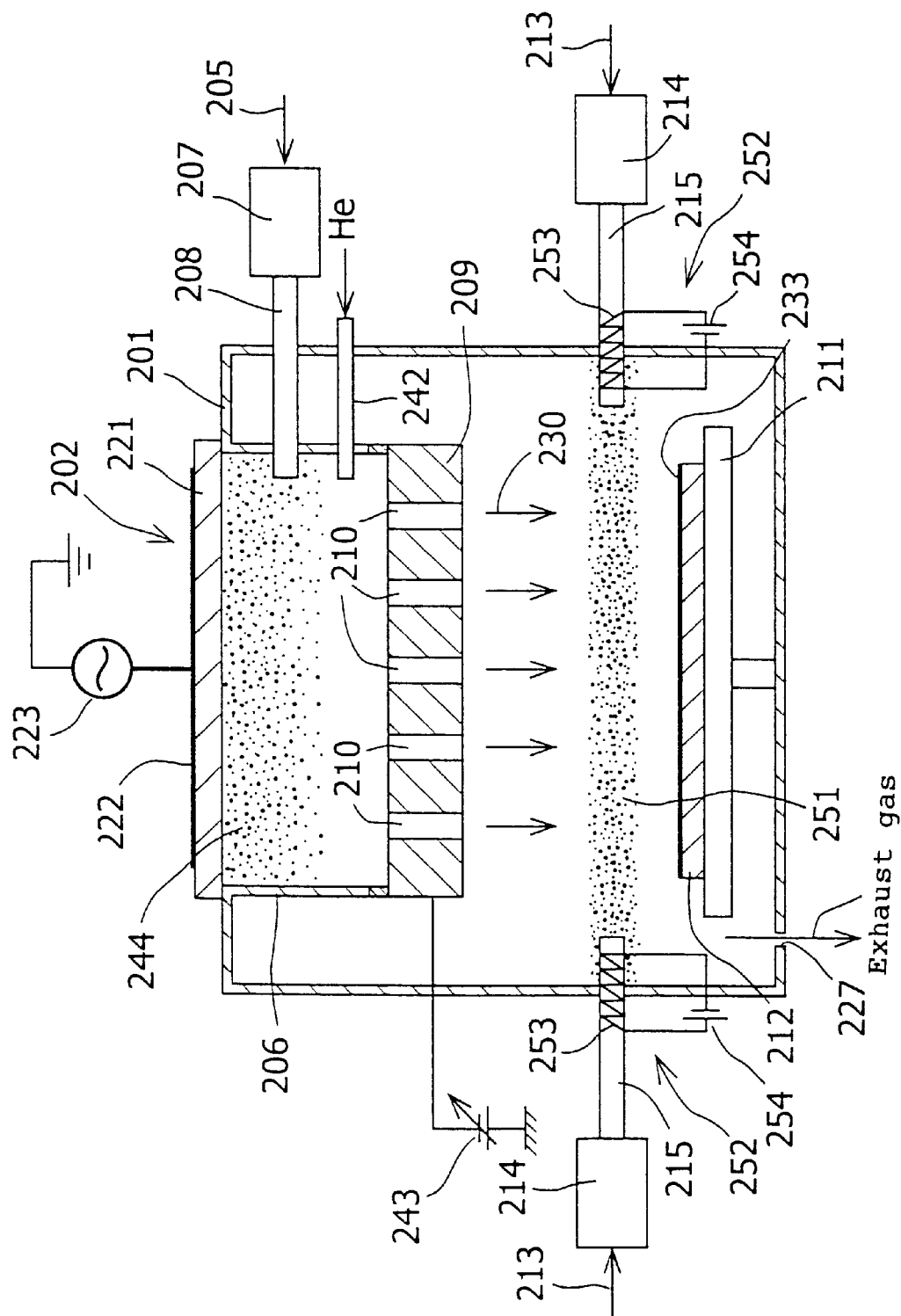
FIG. 14 is a schematic side view of an apparatus for the formation of a metal film in accordance with a tenth embodiment of the present invention.

Now, an apparatus and method for the formation of a metal film in accordance with a tenth embodiment of the present invention is described with reference to FIG. 14. FIG. 14 is a schematic side view of the apparatus for the formation of a metal film in accordance with the tenth embodiment of the present invention. The same components as those shown in FIG. 13 are designated by the same reference numerals and the duplicate explanation thereof is omitted.

When compared with the apparatus for the formation of a metal film as illustrated in FIG. 13, the apparatus for the formation of a metal film in accordance with the tenth embodiment as illustrated in FIG. 14 does not include the chamber heating means comprising filament type heater 228 and power supply 229, but includes a discharge plate heating means for heating discharge plate 209. Specifically, discharge plate (or metallic plate) 209 made of Copper (Cu) is provided at the bottom of inlet vessel 206 through the medium of an insulating member 241. An auxiliary nozzle 242 for feeding a rare gas comprising He gas is connected to the sidewall of inlet vessel 206. Thus, He gas is fed into inlet vessel 206 together with raw material gas 205 comprising chlorine gas ($Cl_2$ gas). $Cl_2$ gas and He gas are fed into inlet vessel 206 in a ratio of approximately 1:1. A biasing power supply 243 is connected to discharge plate 209, so that a direct-current voltage is applied to discharge plate 209 by biasing power supply 243.

In the above-described apparatus for the formation of a metal film, when electromagnetic waves are radiated into inlet vessel 206 by first plasma antenna 222 of first plasma generating means 202, the $Cl_2$ gas and He gas within inlet vessel 206 are ionized to generate $Cl_2$—He gas plasma 244. This $Cl_2$—He gas plasma 244 causes He ions to collide with discharge plate 209 to which a bias voltage is applied. Thus, discharge plate 209 is uniformly heated. As the means for heating discharge plate 209, a heater or other means for heating discharge plate 209 directly may also be used in place of the means based on the collision of He ions.

The heating temperature of discharge plate 209 is, for example, in the range of 200 to 800° C. and preferably 600°

C. It is preferable that the lower limit of the heating temperature is a temperature at which precursor ($Cu_xCl_y$) 230 passing through discharge orifices 210 becomes a monomeric compound rather than a polymeric one. When discharge plate 209 is heated to 600° C., precursor 230 tends to be monomeric CuCl and this facilitates the reduction reaction which will be described later. The upper limit of the heating temperature depends on the material of discharge plate 209. In the case of discharge plate 209 made of copper (Cu), the upper limit is 800° C. If the heating temperature exceeds 800° C., discharge plate 209 cannot be used because of its softening. Discharge plate 209 can be adjusted to a desired temperature by controlling the voltage applied to discharge plate 209.

When $Cl_2$—He gas plasma 244 is generated within inlet vessel 206, the $Cl_2$ gas plasma causes an etching reaction of the heated discharge plate 209 made of Cu, so that a monomeric precursor (CuCl) 230 tends to be produced. The resulting precursor (CuCl) 230 is discharged downward through discharge orifices 210 of discharge plate 209. Immediately before precursor (CuCl) 230 discharged downward through discharge orifices 210 arrives at substrate 212, it passes through atomic reducing gas 251. Thus, chlorine is removed from precursor (CuCl) 230 by a reduction reaction with atomic hydrogen. The resulting Cu ions are directed onto substrate 212 to form a thin Cu film 233 on the surface of substrate 212.

Since precursor 230 discharged downward comprises monomeric CuCl, it can readily be reduced by atomic hydrogen. Thus, chlorine is removed therefrom by reduction in a short period of time. Consequently, the resulting Cu ions are directed onto substrate 212 to form a thin Cu film 233 on the surface of substrate 212 in a short period of time. That is, since discharge plate 209 is uniformly heated to a desired temperature by the collision of He ions, a monomeric precursor (CuCl) 230 which can readily be reduced is produced. This makes it possible to remove chlorine by reduction in a short period of time and thereby improve the rate of film growth.

Figure 15:
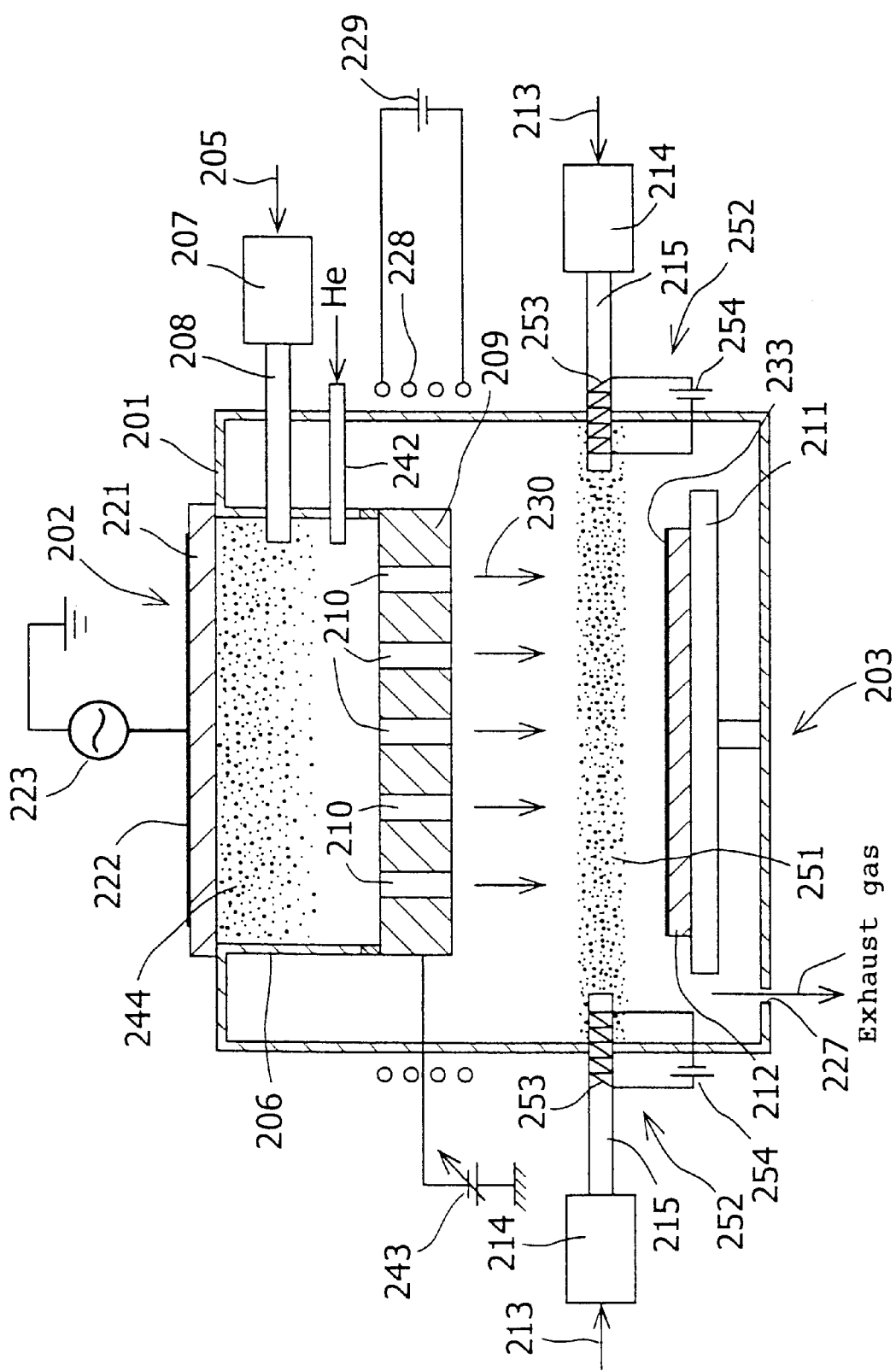
FIG. 15 is a schematic side view of an apparatus for the formation of a metal film in accordance with an eleventh embodiment of the present invention.

Now, an apparatus and method for the formation of a metal film in accordance with an eleventh embodiment of the present invention is described with reference to FIG. 15. FIG. 15 is a schematic side view of the apparatus for the formation of a metal film in accordance with the eleventh embodiment of the present invention. The same components as those shown in FIGS. 13 and 14 are designated by the same reference numerals and the duplicate explanation thereof is omitted.

When compared with the apparatus for the formation of a metal film as illustrated in FIG. 14, the apparatus for the formation of a metal film in accordance with the eleventh embodiment as illustrated in FIG. 15 includes a chamber heating means comprising a filament type heater 228 and a power supply 229. That is, this apparatus is equipped with both the chamber heating means and the discharge plate heating means.

Thus, since the sidewall of chamber 201 is heated to a predetermined temperature (e.g., 200° C.) by heater 228, precursor (CuCl) 230 adhering to the sidewall of chamber 201 will readily be vaporized because of its raised vapor pressure. Consequently, precursor (CuCl) 230 is prevented from depositing on the sidewall of chamber 201. Moreover, since precursor 230 discharged downward comprises monomeric CuCl, it can readily be reduced by atomic hydrogen. Thus, chlorine is removed therefrom by reduction in a short period of time. Consequently, the resulting Cu ions are directed onto substrate 212 to form a thin Cu film 233 on the surface of substrate 212 in a short period of time.

Accordingly, since the sidewall of chamber 201 is heated to a predetermined temperature by heater 228, precursor (CuCl) 230 adhering to the sidewall of chamber 201 will readily be vaporized because of its raised vapor pressure. Thus, precursor (CuCl) 230 is prevented from depositing on the sidewall of chamber 201. Consequently, the necessity of cleaning the inside of chamber 201 periodically can be eliminated to cause an improvement in raw material efficiency and a reduction in running cost. Moreover, since discharge plate 209 is uniformly heated to a desired temperature by the collision of He ions, a monomeric precursor (CuCl) 230 which can readily be reduced is produced. This makes it possible to remove chlorine by reduction in a short period of time and thereby improve the rate of film growth.

Figure 16:
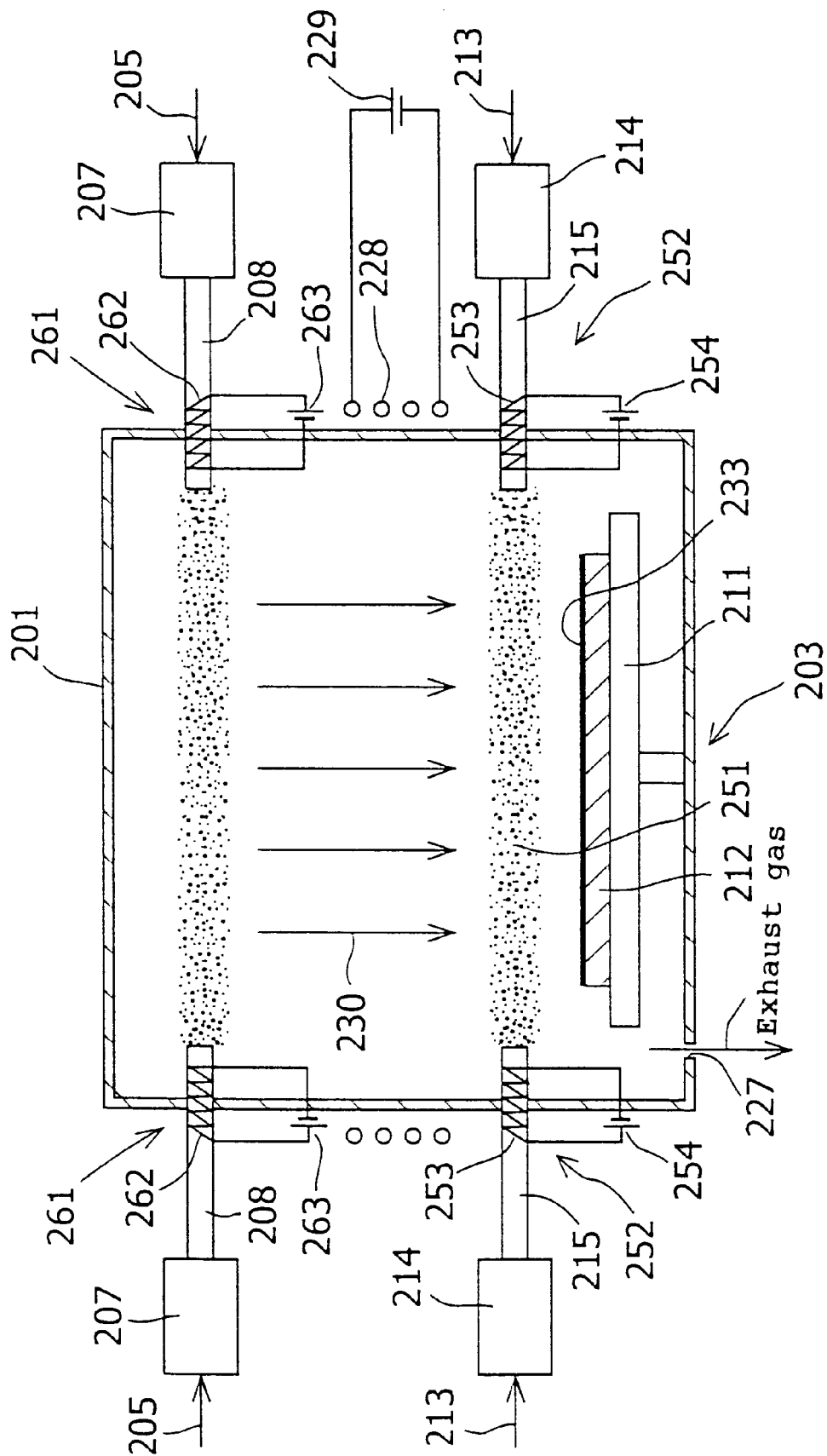
FIG. 16 is a schematic side view of an apparatus for the formation of a metal film in accordance with a twelfth embodiment of the present invention.

Now, an apparatus and method for the formation of a metal film in accordance with a twelfth embodiment of the present invention is described with reference to FIG. 16. FIG. 16 is a schematic side view of the apparatus for the formation of a metal film in accordance with the twelfth embodiment of the present invention. The same components as those shown in FIG. 13 are designated by the same reference numerals and the duplicate explanation thereof is omitted.

When compared with the apparatus for the formation of a metal film as illustrated in FIG. 13, the apparatus for the formation of a metal film in accordance with the twelfth embodiment as illustrated in FIG. 16 is characterized in that a precursor ($Cu_xCl_y$) 230 is injected into chamber 201 from a nozzle 208 of a raw material gas heating means 261, instead of generating $Cl_2$ gas plasma 231 within inlet vessel 206 to produce precursor ($Cu_xCl_y$) 230. Raw material gas heating means 261 consists of a flow controller 207, a nozzle 208 attached thereto, and a copper filament 262 comprising several turns of copper wire and disposed within nozzle 208. The ends of copper filament 262 are connected to a direct-current power supply 263. Copper filament 262 is heated to 300–600° C. by direct-current power supply 263.

In the above-described apparatus for the formation of a metal film, a raw material gas comprising $Cl_2$ gas is passed through flow controller 207 in order to control its flow rate, and then fed into nozzle 208. Since nozzle 208 is provided therein with copper filament 262 which has been heated to 300–600° C. by direct-current power supply 263, the contact of $Cl_2$ gas with the heated copper filament 262 produces a precursor ($Cu_xCl_y$) 230. When this precursor ($Cu_xCl_y$) 230 is introduced into chamber 201 through nozzle 208, precursor ($Cu_xCl_y$) 230 moves downward.

Immediately before precursor ($Cu_xCl_y$) 230 arrives at substrate 212, a reducing gas 213 comprising $H_2$ gas is passed through reducing gas flow controllers 214 in order to control its flow rate, and tungsten filament 253 is heated to 1,800° C. by means of direct-current power supply 254. As a result of the hearing of tungsten filament 253, an atomic reducing gas 251 (atomic hydrogen) is produced and injected into chamber 201 through reducing gas inlet nozzle 215. Consequently, precursor ($Cu_xCl_y$) 230 discharged downward through discharge orifices 210 passes through atomic reducing gas 251 immediately before arriving at substrate 212. Thus, chlorine is removed from precursor ($Cu_xCl_y$) 230 by a reduction reaction with atomic hydrogen. The resulting Cu ions are directed onto substrate 212 to form a thin Cu film 233 on the surface of substrate 212.

Since the sidewall of chamber 201 is heated to a predetermined temperature (e.g., 200° C.) by heater 228 as described previously, precursor ($Cu_xCl_y$) 230 adhering to-the sidewall of chamber 201 will readily be vaporized because of its raised vapor pressure. Consequently, precursor ($Cu_xCl_y$) 230 is prevented from depositing on the sidewall of chamber 201.

In the above-described apparatus for the formation of a metal film, since precursor ($Cu_xCl_y$) 230 can be fed simply by use of nozzle 208 which permits a relatively flexible arrangement, and atomic hydrogen can be fed simply by use of reducing gas nozzle 215 which permits a relatively flexible arrangement, a film having a large area (e.g., 100 mm×100 mm) can be very stably formed.

Moreover, since the sidewall of chamber 201 is heated to a predetermined temperature by heater 228, precursor (CuCl) 230 adhering to the sidewall of chamber 201 will readily be vaporized because of its raised vapor pressure. Thus, precursor (CuCl) 230 is prevented from depositing on the sidewall of chamber 201. Consequently, the necessity of cleaning the inside of chamber 201 periodically can be eliminated to cause an improvement in raw material efficiency and a reduction in running cost.

Figure 17:
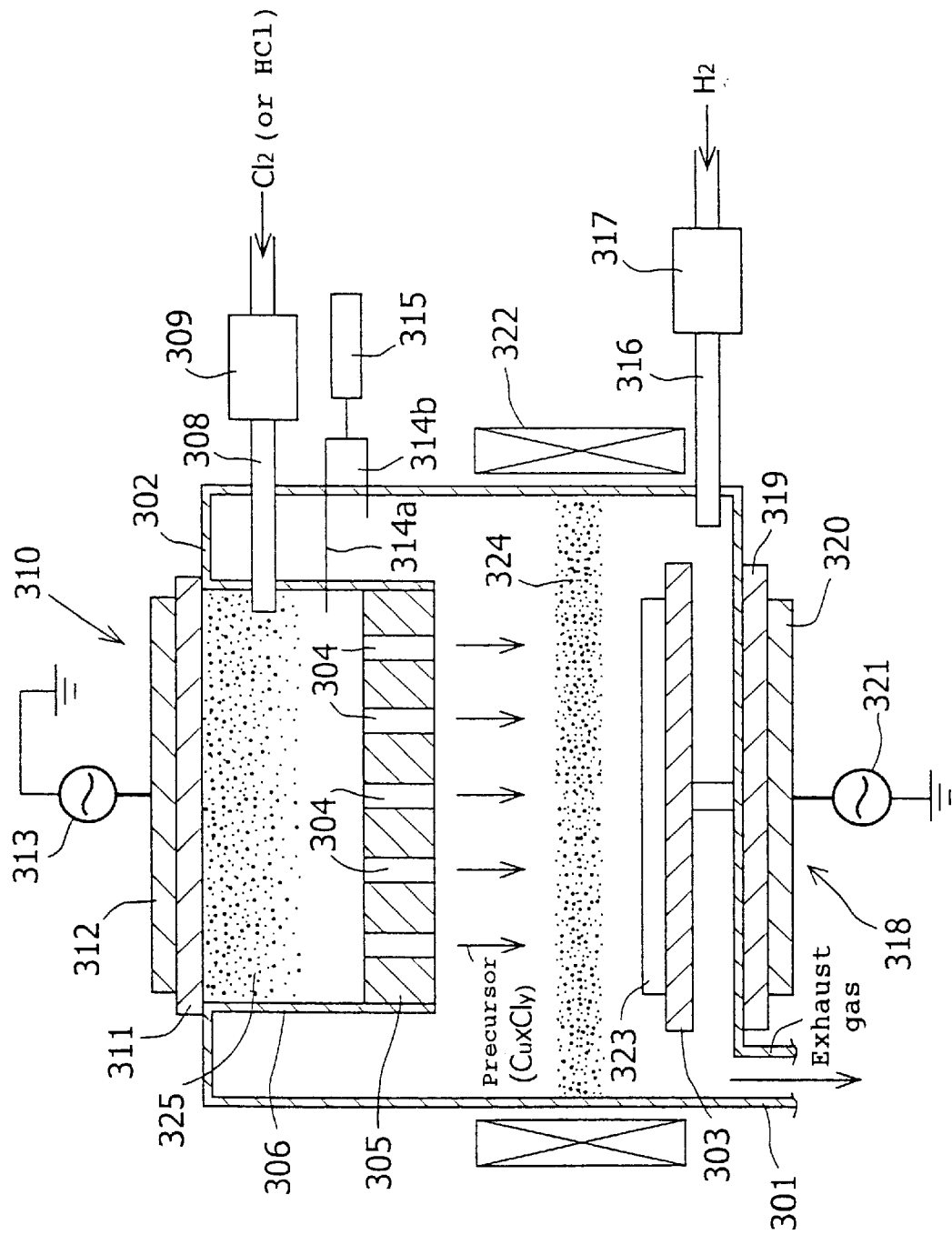
FIG. 17 is a schematic sectional view of an apparatus for the vapor phase growth of a thin copper film in accordance with a thirteenth embodiment of the present invention.
Figure 18:
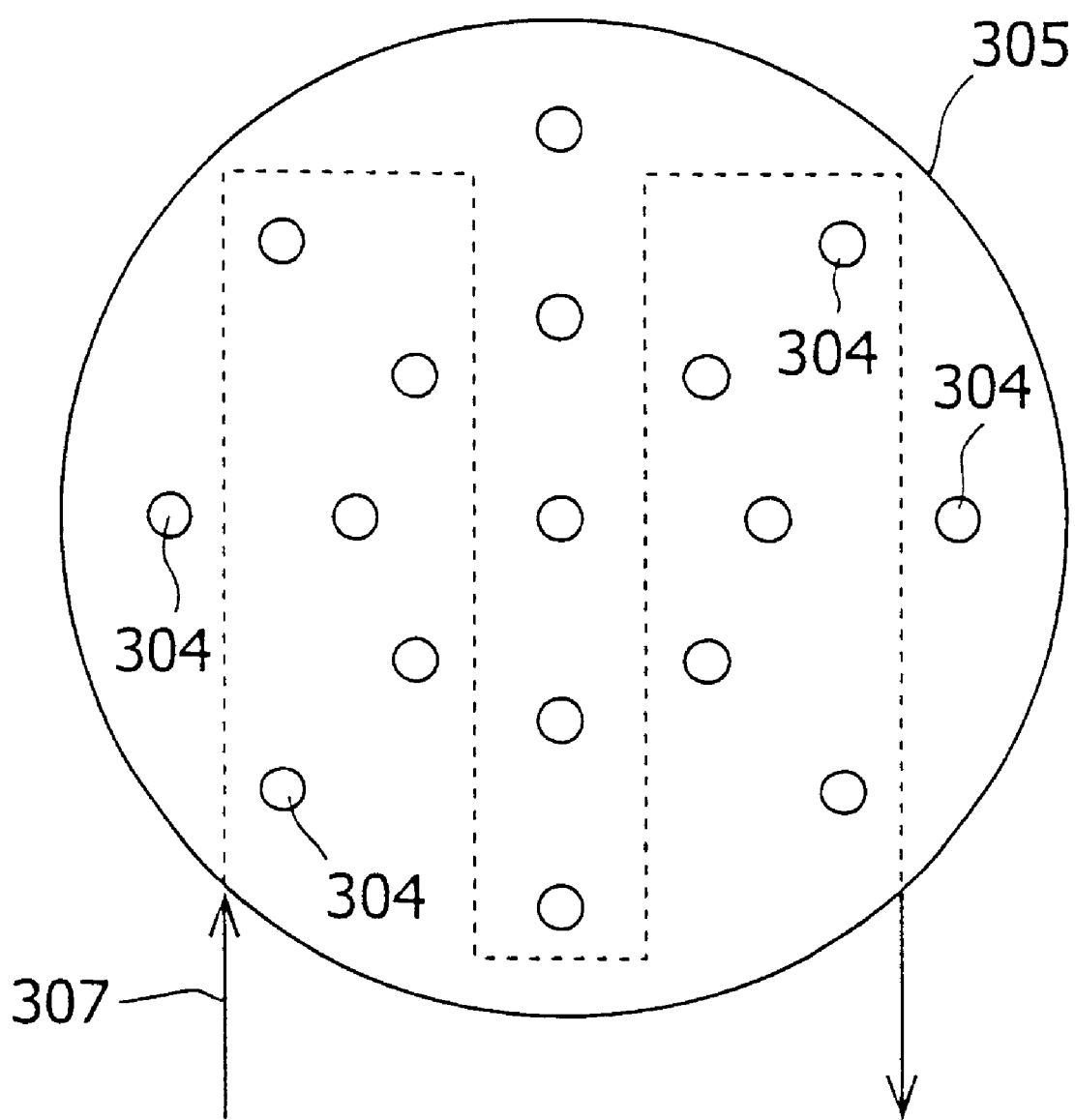
FIG. 18 is a plan view of the copper discharge plate incorporated in the vapor phase growth apparatus of FIG. 17.

FIG. 17 is a schematic sectional view of an apparatus for the vapor phase growth of a thin copper film in accordance with a thirteenth embodiment of the present invention, and FIG. 18 is a plan view of a discharge plate made of copper and incorporated into the vapor phase growth apparatus of FIG. 17.

Within a reaction vessel 302 formed into the shape of a box and provided with an exhaust tube 301 at the bottom, a flat plate type heater 303 is disposed and a substrate to be treated is placed thereon. An evacuation means (not shown), such as a vacuum pump, is connected to the other end of the aforesaid exhaust tube 301. An inlet vessel 306 in the form of a closed-end cylinder, which has a copper discharge plate 305 having a plurality of discharge orifices 304 bored therethrough at the bottom, is suspended in the upper part of the aforesaid reaction vessel 302. The aforesaid copper discharge plate 305 is provided with a circulation pipe 307 serving as a temperature control means for passing a heating medium (e.g., heated air) or a cooling medium (e.g., cooled air) therethrough. As illustrated in FIG. 18, this circulation pipe 307 is built in the aforesaid copper discharge plate 305 so that it lies in parallel with the surfaces of discharge plate 305 and runs in a serpentine manner.

A raw material gas feed pipe 308 for feeding chlorine or hydrogen chloride extends from the outside through the sidewall of the aforesaid reaction vessel 302 and the sidewall of the aforesaid inlet vessel 306, and is inserted into the interior of the aforesaid inlet vessel 306. A flow controller 309 is installed in a portion of the aforesaid raw material gas feed pipe 308 which is located on the outside of the aforesaid reaction vessel 302. A first plasma generator 310 is disposed on the top surface of the aforesaid reaction vessel 302 to which the aforesaid inlet vessel 306 is attached. This first plasma generator 310 consists of an insulating plate 311 disposed on the top surface of the aforesaid reaction vessel 302 so as to cover the aforesaid inlet vessel 306, a first plasma antenna 312 disposed on this insulating plate 311, and a first plasma power supply 313 connected to this first plasma antenna 312.

A water partial pressure gauge 315 having two sensing elements 314a and 314b is disposed on the outside of the aforesaid reaction vessel 302. One sensing elements 314a extends through the sidewall of the aforesaid reaction vessel 302 and the sidewall of the aforesaid inlet vessel 306, and is inserted into the interior of the aforesaid inlet vessel 306. The other sensing elements 314b extends through the sidewall of the aforesaid reaction vessel 302 and is inserted into the interior of the aforesaid reaction vessel 302. The aforesaid water partial pressure gauge 341 is used to measure the partial pressure of water when the aforesaid reaction vessel 302 and the aforesaid inlet vessel 306 are evacuated prior to film formation. A hydrogen feed pipe 316 for feeding a reducing gas (e.g., hydrogen) extends from the outside through the lower sidewall of the aforesaid reaction vessel 302 and is inserted into the interior of the aforesaid reaction vessel 302. A flow controller 317 is installed in a portion of the aforesaid hydrogen feed pipe 316 which is located on the outside of the aforesaid reaction vessel 302. A second plasma generator 318 is disposed at the bottom of the aforesaid reaction vessel 302. This second plasma generator 318 consists of an insulating plate 319 disposed on the bottom surface of the aforesaid reaction vessel 302, a second plasma antenna 320 disposed on the underside of this insulating plate 319, and a second plasma power supply 321 connected to the underside of this second plasma antenna 320. A rotating magnetic field coil 322 is disposed around the lower sidewall of the aforesaid reaction vessel 302 with a desired space left therebetween. This rotating magnetic field coil 322 acts on the hydrogen plasma generated above the aforesaid heater 303 of the aforesaid reaction vessel 302 as will be described later so that the hydrogen plasma may be densely distributed in the neighborhood of the surface of the substrate to be treated which is placed on the aforesaid heater 303.

Now, the method for forming a thin copper film by using the above-described apparatus for the vapor phase growth of a thin copper film as illustrated in FIGS. 17 and 18 is described below.

First of all, a substrate 323 to be treated is placed on the flat plate type heater 303 of reaction vessel 302. An evacuation means (not shown) is operated to remove the gas (air) within the aforesaid reaction vessel 302 and inlet vessel 306 through exhaust tube 301 until a predetermined degree of vacuum is reached.

In this evacuation step, the partial pressures of water within the aforesaid reaction vessel 302 and inlet vessel 306 are measured by means of water partial pressure gauge 315 to confirm that the partial pressures of water remain constant. After the partial pressures of water have been confirmed, hydrogen is fed into the aforesaid reaction vessel 302 through hydrogen feed pipe 316. The flow rate of this hydrogen is controlled by means of flow controller 317 installed in the aforesaid hydrogen feed pipe 316. The second plasma power supply 321 of second plasma generator 318 is operated to apply, for example, high-frequency electric power to the aforesaid second plasma antenna 320 and thereby generate hydrogen plasma 324 above and near the aforesaid substrate 323 to be treated. Under the action of a rotating magnetic field created by rotating magnetic field coil 322 disposed on the outside of the aforesaid reaction vessel 302, the aforesaid hydrogen plasma 324 is densely distributed in the neighborhood of the surface of the aforesaid substrate 323 to be treated.

Then, a raw material gas comprising, for example, chlorine ($Cl_2$) is fed into the aforesaid inlet vessel 306 through raw material gas feed pipe 308. The flow rate of this chlorine is controlled by means of flow controller 309 installed in the aforesaid raw material gas feed pipe 308. A heating medium (e.g., heated air) heated to a predetermined temperature is supplied to and circulated through the circulation pipe 307 of copper discharge plate 305. Thus, copper discharge plate 305 is heated to a predetermined temperature. After heating copper discharge plate 305, the first plasma power supply 313 of first plasma generator 310 is operated to apply, for example, high-frequency electric power to the aforesaid first plasma antenna 312 and thereby generate chlorine plasma 325 within the aforesaid inlet vessel 306. If the temperature of the aforesaid discharge plate 305 is excessively raised with the generation of chlorine plasma 325, the aforesaid discharge plate 305 may be adjusted to a desired temperature by supplying a cooling medium to the aforesaid circulation pipe 307 in place of the aforesaid heating medium.

As a result of the above-described generation of chlorine plasma 324, activated chlorine in this plasma 324 reacts with copper discharge plate 305 which has been heated to a predetermined temperature by supplying and circulating a heating medium through the aforesaid circulation pipe 307. Thus, a precursor ($Cu_xCl_y$) comprising copper chloride is produced. As shown by arrows in FIG. 17, the resulting precursor ($Cu_xCl_y$) is discharged into the aforesaid reaction vessel 302 through the plurality of discharge orifices 304 of the aforesaid discharge plate 305. Immediately before the discharged precursor arrives at substrate 323 to be treated which is placed on flat plate type heater 303, it passes through the aforesaid hydrogen plasma 324 and undergoes a reduction reaction with atomic hydrogen in this hydrogen plasma 324. Consequently, copper produced by the reduction reaction of the precursor ($Cu_xCl_y$) with atomic hydrogen grows on the aforesaid substrate 323 to be treated, resulting in the formation of a thin copper film.

Thus, according to the thirteenth embodiment, an inexpensive copper chloride precursor ($Cu_xCl_y$) useful as a raw material for the vapor phase growth of copper can be produced by feeding inexpensive chlorine into inlet vessel 306 having copper discharge plate 305 at the bottom through raw material feed pipe 308, generating chlorine plasma 325 within the aforesaid inlet vessel 306 by means of first plasma generator 310, and reacting activated chlorine in this plasma 325 with the aforesaid copper discharge plate 305. Moreover, since the reaction of activated chlorine in plasma 325 with the aforesaid copper discharge plate 305 can be accelerated by supplying and circulating a heating medium through circulation pipe 307 built in the aforesaid copper discharge plate 305 and thus heating the aforesaid copper discharge plate 305 to a predetermined temperature, the amount of precursor ($Cu_xCl_y$) produced can be increased.

The precursor so produced is discharged into reaction vessel 302 through the plurality of discharge orifices 304 of the aforesaid discharge plate 305, and subjected to a reduction reaction with atomic hydrogen while it passes through hydrogen plasma 324 previously generated within the aforesaid reaction vessel 302.

Thus, a thin copper film can be rapidly formed on the aforesaid substrate 323 to be treated, because copper can grow at a relatively higher rate than in thermal decomposition processes.

Moreover, copper discharge plate 305 begins to react with activated chlorine in the aforesaid chlorine plasma 325 when copper discharge plate 305 is heated to a certain temperature by supplying and circulating a heating medium through circulation pipe 307 built in copper discharge plate 305. Consequently, the pressure of the precursor discharged through the plurality of discharge orifices 304 of the aforesaid copper discharge plate (i.e., the discharge pressure) can be stabilized.

Moreover, the same type of precursor ($Cu_xCl_y$) is produced. As a result, the rate of copper film growth on the aforesaid substrate 323 to be treated can be stabilized, so that a thin copper film having a desired thickness can be reproducibly formed on the aforesaid substrate 323 to be treated.

Furthermore, not only the aforesaid precursor ($Cu_xCl_y$) undergoes a reduction reaction with atomic hydrogen while it passes through hydrogen plasma 324, and causes the vapor phase growth of copper on the surface of the aforesaid substrate 323 to be treated, but also atomic hydrogen in hydrogen plasma 324 exerts a reducing action on the growing copper film. Consequently, a thin copper film containing little residual can be formed.

In the above-described thirteenth embodiment, a circulation pipe for passing a heating medium or cooling medium therethrough is used as the temperature control means for the aforesaid copper discharge plate. However, the present invention is not limited thereto, but the aforesaid copper discharge plate may be provided with a combination of a heater and a circulation pipe for a cooling medium.

Although chlorine is used as the raw material gas in the above-described thirteenth embodiment, a copper chloride precursor ($Cu_xCl_y$) can also be produced by using hydrogen chloride.

Although atomic hydrogen is produced by converting hydrogen into a plasma in the above-described thirteenth embodiment, atomic hydrogen may also be produced by installing a heater (e.g., a tungsten filament) for heating hydrogen fed into the aforesaid reaction vessel.

Figure 19:
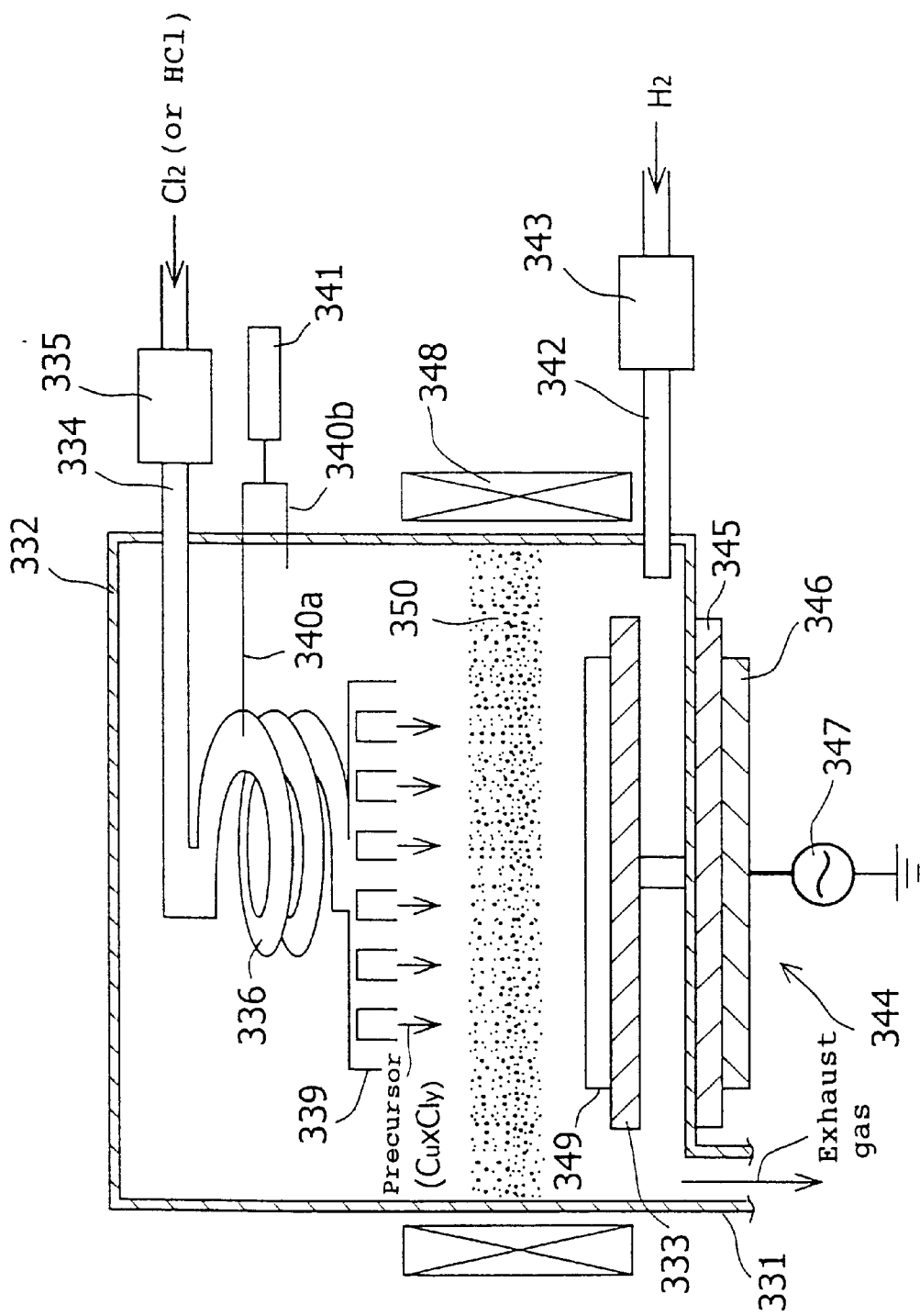
FIG. 19 is a schematic sectional view of an apparatus for the vapor phase growth of a thin copper film in accordance with a fourteenth embodiment of the present invention.

FIG. 19 is a schematic sectional view of an apparatus for the vapor phase growth of a thin copper film in accordance with a fourteenth embodiment of the present invention, FIG. 20(A) is a longitudinal sectional view of a spiral tube incorporated into the vapor phase growth apparatus of FIG. 19, FIG. 20(B) is a transverse sectional view of this spiral tube, FIG. 21(A) is a longitudinal sectional view of another type of spiral tube incorporated into the vapor phase growth apparatus of FIG. 19, and FIG. 21(B) is a transverse sectional view of this spiral tube.

Within a reaction vessel 332 formed into the shape of a box and provided with an exhaust tube 331 at the bottom, a flat plate type heater 333 is disposed and a substrate to be treated is placed thereon. An evacuation means (not shown), such as a vacuum pump, is connected to the other end of the aforesaid exhaust tube 331.

Figure 20:
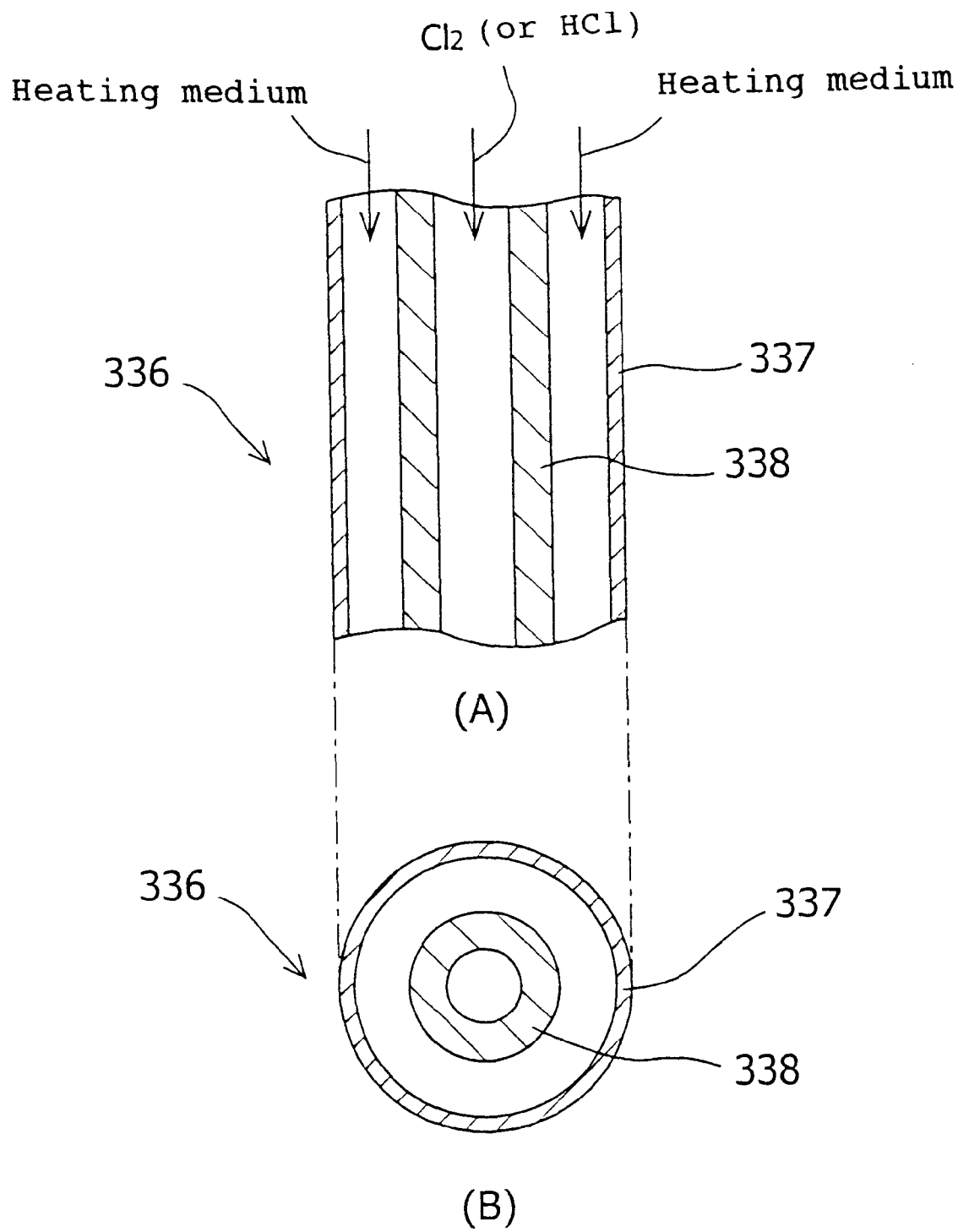
FIG. 20 is a view of one form of the spiral tube incorporated in the vapor phase growth apparatus of FIG. 19.

A raw material gas feed pipe 334 for feeding chlorine or hydrogen chloride extends from the outside through the sidewall of the aforesaid reaction vessel 332 and is inserted into the upper part of the aforesaid reaction vessel 332. A flow controller 335 is installed in a portion of the aforesaid raw material gas feed pipe 334 which is located on the outside of the aforesaid reaction vessel 332. The aforesaid reaction vessel 332 includes a spiral tube 336 having a raw material gas flow passage whose inner surface is made of copper, and equipped with a heating element. Its upper end is connected to the end of the aforesaid raw material gas feed pipe 334 which is located on the inside of the aforesaid reaction vessel 332. This spiral tube 336 has, for example, a dual tubular structure consisting of an outer tube 337 and an inner copper tube 338 inserted into this outer tube 337 and connected to the aforesaid raw material gas feed pipe 334, as illustrated in FIG. 20. The aforesaid raw material gas is made to flow through the aforesaid inner copper tube 338, and a heating medium (e.g., heated air) is made to flow through the annular space between the aforesaid outer tube 337 and the aforesaid inner copper tube 338. A heating medium feed pipe (not shown), which extends through a wall of the aforesaid reaction vessel 332, is connected to a portion of outer tube 337 of spiral tube 336 which is located in the neighborhood of its joint with the aforesaid raw material gas feed pipe 334, and used to feed a heating medium into the annular space between the aforesaid outer tube 337 and the aforesaid inner copper tube 338. Moreover, a heating medium discharge pipe (not shown), which extends through a wall of the aforesaid reaction vessel 332, is connected to a portion of outer tube 337 which is located in the neighborhood of the lower end of the aforesaid spiral tube 336, and used to discharge the heating medium fed into the aforesaid annular space to the outside.

A precursor discharge member 339 is disposed within the aforesaid reaction vessel 332 in such a way that the aforesaid precursor discharge member 339 lies under the aforesaid spiral tube 336 and its upper part is connected to the aforesaid spiral tube 336.

A water partial pressure gauge 341 having two sensing elements 340a and 340b is disposed on the outside of the aforesaid reaction vessel 332. One sensing elements 340a extends through the sidewall of the aforesaid reaction vessel 332 and the outer tube 337 and inner copper tube 338 of the aforesaid spiral tube 336, and is inserted into the interior of the aforesaid inner copper tube 338. The other sensing elements 340b extends through the sidewall of the aforesaid reaction vessel 332 and is inserted into the interior of the aforesaid reaction vessel 332. The aforesaid water partial pressure gauge 341 is used to measure the partial pressure of water when the aforesaid reaction vessel 332 and the inner copper tube 338 of the aforesaid spiral tube 336 are evacuated prior to film formation.

A hydrogen feed pipe 342 for feeding a reducing gas (e.g., hydrogen) extends from the outside through the lower sidewall of the aforesaid reaction vessel 332 and is inserted into the interior of the aforesaid reaction vessel 332. A flow controller 343 is installed in a portion of the aforesaid hydrogen feed pipe 342 which is located on the outside of the aforesaid reaction vessel 332. A plasma generator 344 is disposed at the bottom of the aforesaid reaction vessel 332. This plasma generator 344 consists of an insulating plate 345 disposed on the bottom surface of the aforesaid reaction vessel 332, a plasma antenna 346 disposed on the underside of this insulating plate 345, and a plasma power supply 347 connected to the underside of this plasma antenna 346. A rotating magnetic field coil 348 is disposed around the lower sidewall of the aforesaid reaction vessel 332 with a desired space left therebetween. This rotating magnetic field coil 348 acts on the hydrogen plasma generated above the aforesaid heater 333 of the aforesaid reaction vessel 332 as will be described later so that the hydrogen plasma may be densely distributed in the neighborhood of the surface of the substrate to be treated which is placed on the aforesaid heater 333.

Now, the method for forming a thin copper film by using the above-described apparatus for the vapor phase growth of a thin copper film as illustrated in FIGS. 19 and 20 is described below.

First of all, a substrate 349 to be treated is placed on the flat plate type heater 333 of reaction vessel 332. An evacuation means (not shown) is operated to remove the gas (air) within the aforesaid reaction vessel 332 and the inner copper tube 338 of spiral tube 336 through exhaust tube 331 until a predetermined degree of vacuum is reached.

In this evacuation step, the partial pressures of water within the aforesaid reaction vessel 332 and the inner copper tube 338 of spiral tube 336 are measured by means of water partial pressure gauge 341 to confirm that the partial pressures of water remain constant. After the partial pressures of water have been confirmed, hydrogen is fed into the aforesaid reaction vessel 332 through hydrogen feed pipe 342. The flow rate of this hydrogen is controlled by means of flow controller 343 installed in the aforesaid hydrogen feed pipe 342. The plasma power supply 347 of plasma generator 344 is operated to apply, for example, high-frequency electric power to the aforesaid plasma antenna 346 and thereby generate hydrogen plasma 350 above and near the aforesaid substrate 349 to be treated. Under the action of a rotating magnetic field created by rotating magnetic field coil 348 disposed on the outside of the aforesaid reaction vessel 332, the aforesaid hydrogen plasma 350 is densely distributed in the neighborhood of the surface of the aforesaid substrate 349 to be treated.

Then, a raw material gas comprising, for example, chlorine ($Cl_2$) is fed into the inner copper tube 338 of the aforesaid spiral tube 336 through raw material gas feed pipe 334. The flow rate of this chlorine is controlled by means of flow controller 335 installed in the aforesaid raw material gas feed pipe 334. A heating medium (e.g., heated air) heated to a predetermined temperature is supplied from the outside of the aforesaid reaction vessel 332 through a heating medium feed pipe (not shown) to the annular space between the outer tube 337 and inner copper tube 338 of the aforesaid spiral tube 336. This heating medium is discharged to the outside through a heating medium discharge pipe (not shown). Thus, the inner copper tube 338 of the aforesaid spiral tube 336 is heated to a predetermined temperature, so that the aforesaid inner copper tube 338 reacts with the chlorine ($Cl_2$) flowing therethrough to produce a precursor ($Cu_xCl_y$) comprising copper chloride.

As shown by arrows in FIG. 19, the resulting precursor ($Cu_xCl_y$) is discharged into the aforesaid reaction vessel 332 from precursor discharge member 339. Immediately before the discharged precursor arrives at substrate 349 to be treated which is placed on flat plate type heater 333, it passes through the aforesaid hydrogen plasma 350 and undergoes a reduction reaction with atomic hydrogen in this hydrogen plasma 350. Consequently, copper produced by the reduction reaction of the precursor ($Cu_xCl_y$) with atomic hydrogen grows on the aforesaid substrate 349 to be treated, resulting in the formation of a thin copper film.

Thus, according to the fourteenth embodiment, an inexpensive copper chloride precursor ($Cu_xCl_y$) useful as a raw material for the vapor phase growth of copper can be produced by feeding inexpensive chlorine into the inner copper tube 338 of spiral tube 336, passing a heating medium through the annular space between the outer tube 337 and inner copper tube 338 of the aforesaid spiral tube 336 to heat the aforesaid inner copper tube 338, and thus reacting chlorine with the aforesaid inner copper tube 338.

The precursor so produced is discharged into reaction vessel 332 from precursor discharge member 339, and subjected to a reduction reaction with atomic hydrogen while it passes through hydrogen plasma 350 previously generated within the aforesaid reaction vessel 332. Thus, a thin copper film can be rapidly formed on the aforesaid substrate 349 to be treated, because copper can grow at a relatively higher rate than in thermal decomposition processes.

Moreover, the aforesaid inner copper tube 338 begins to react with chlorine flowing through this inner copper tube 338 when inner copper tube 338 is heated to a certain temperature by passing a heating medium through the annular space between the outer tube 337 and inner copper tube 338 of the aforesaid spiral tube 336. Consequently, the pressure of the precursor discharged from the aforesaid precursor discharge member 339 (i.e., the discharge pressure) can be stabilized. Moreover, the same type of precursor ($Cu_xCl_y$) is produced. As a result, the rate of copper film growth on the aforesaid substrate 349 to be treated can be stabilized, so that a thin copper film having a desired thickness can be reproducibly formed on the aforesaid substrate 349.

Furthermore, not only the aforesaid precursor ($Cu_xCl_y$) undergoes a reduction reaction with atomic hydrogen while it passes through hydrogen plasma 350, and causes the vapor phase growth of copper on the surface of the aforesaid substrate 349 to be treated, but also atomic hydrogen in hydrogen plasma 350 exerts a reducing action on the growing copper film. Consequently, a thin copper film containing little residual impurity (e.g., chlorine) and hence having a good film quality can be formed.

Figure 21:
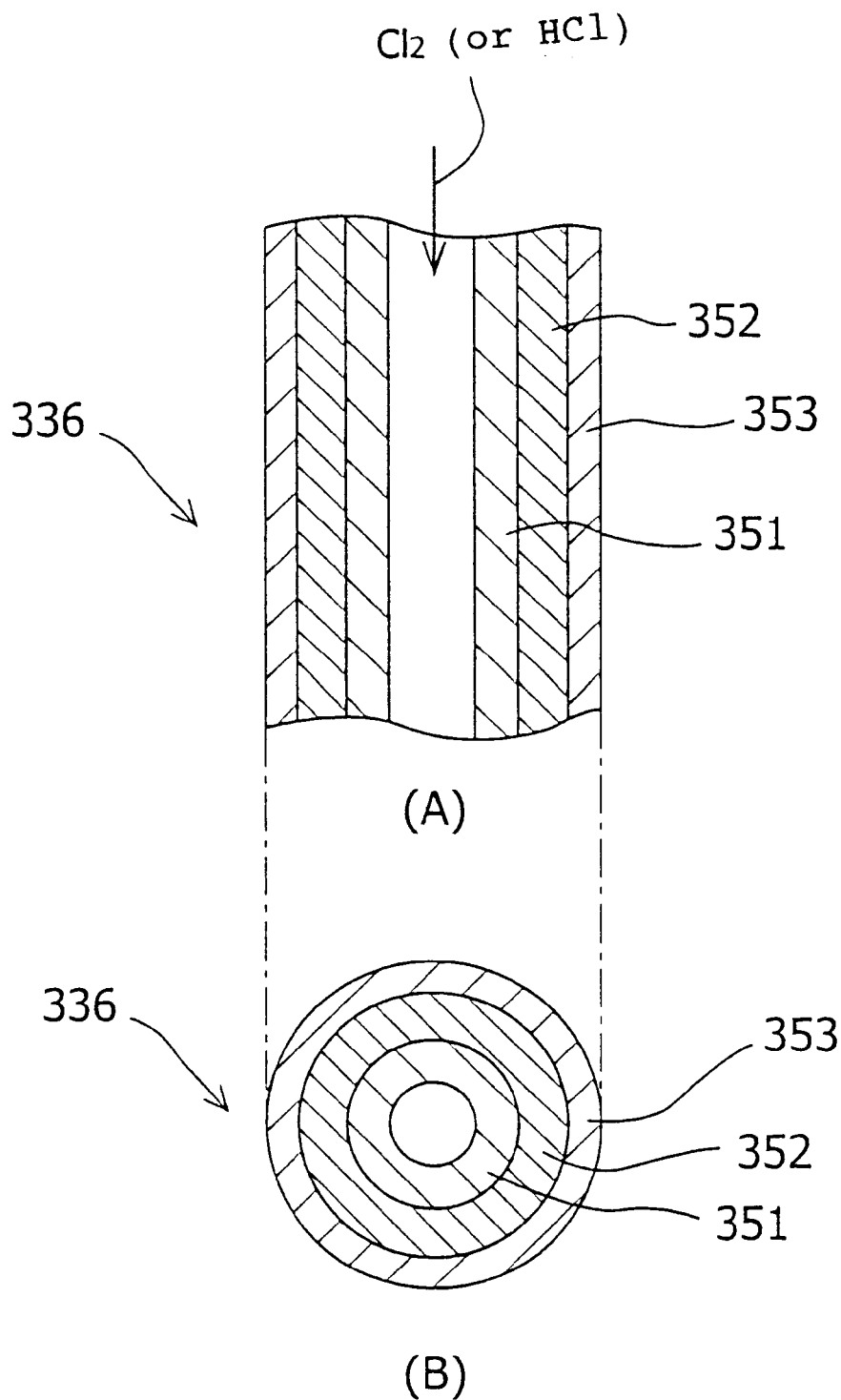
FIG. 21 is a view of another form of the spiral tube incorporated in the vapor phase growth apparatus of FIG. 19.
Figure 22:
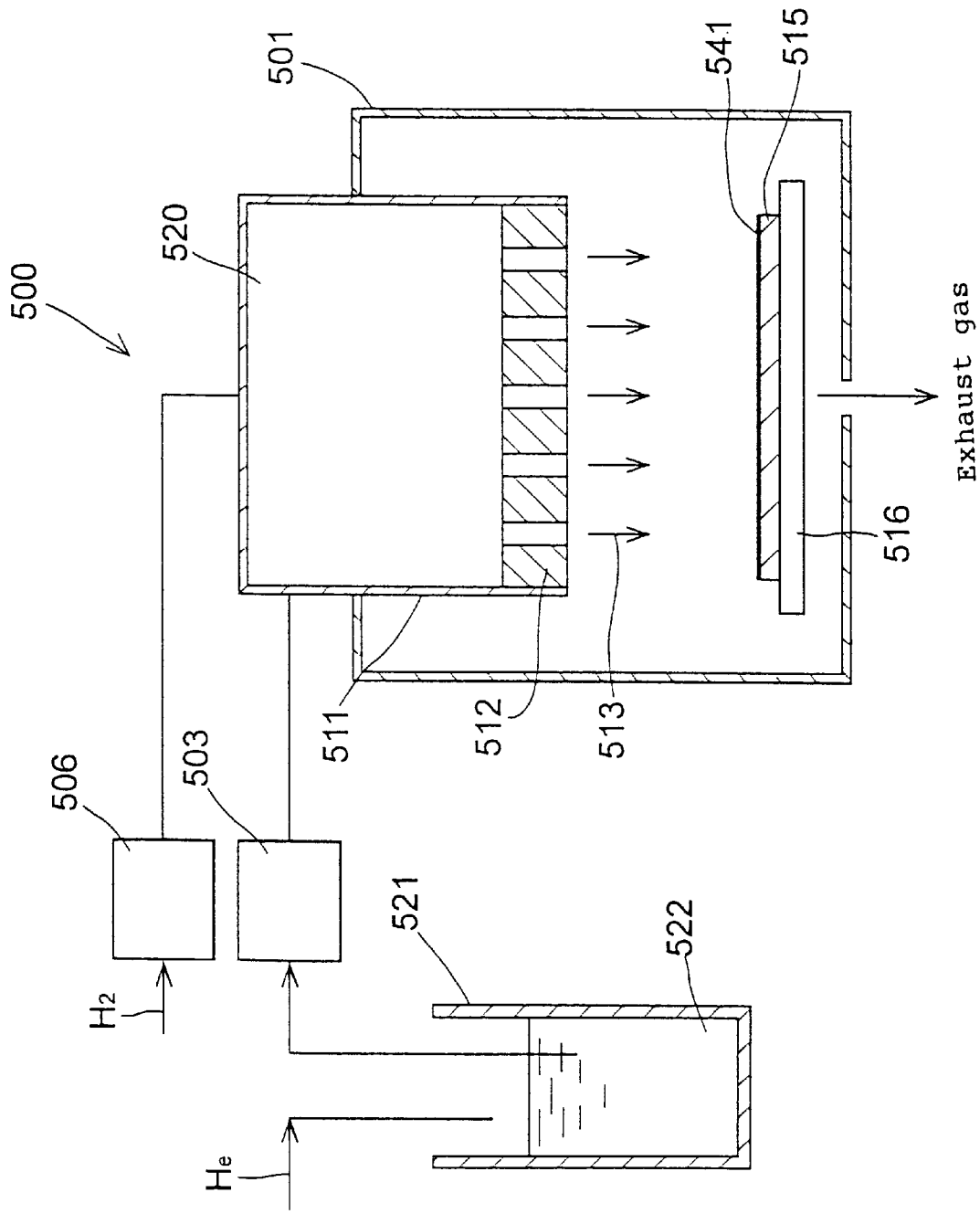
FIG. 22 is a schematic view of a conventional apparatus for the vapor phase growth of a thin noble metal film.
Figure 23:
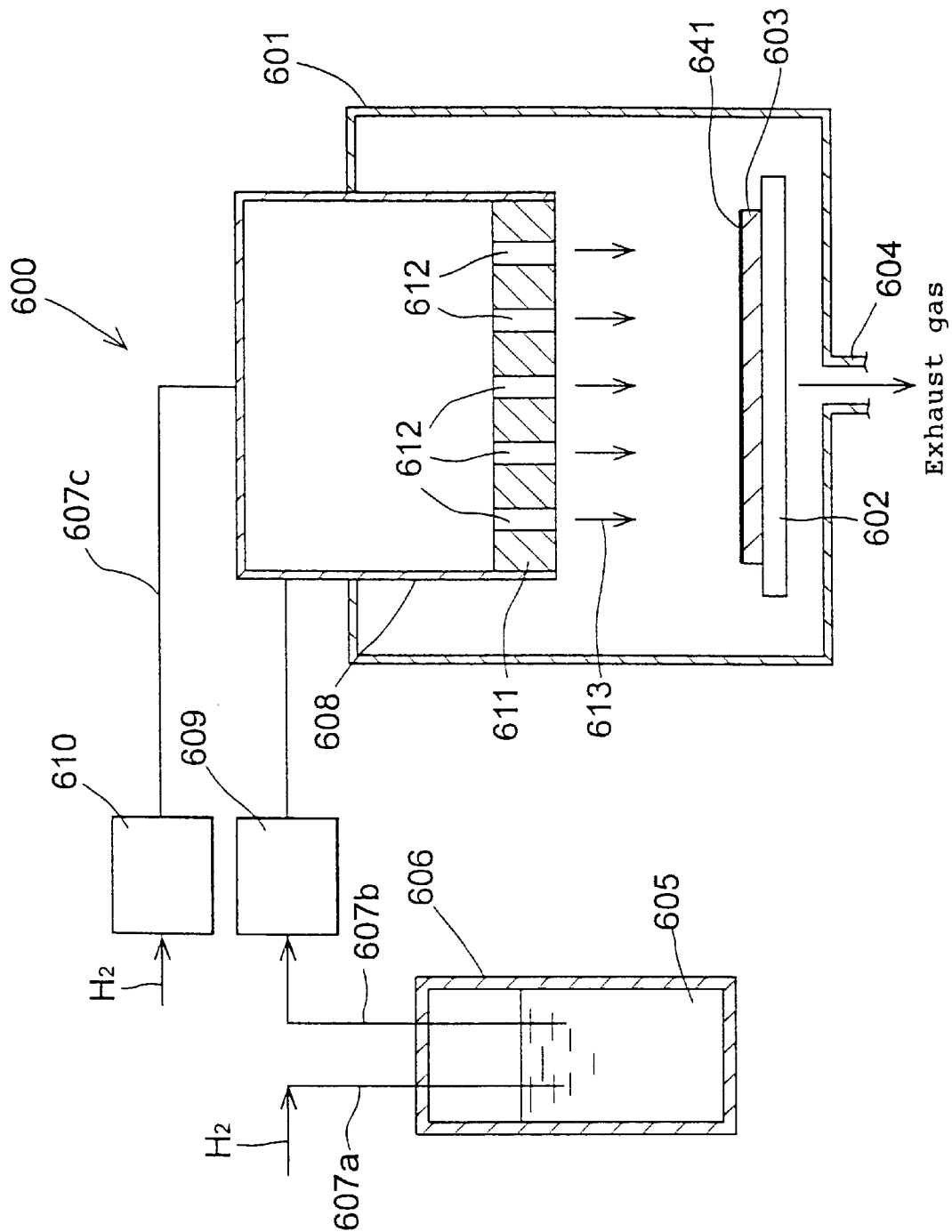
FIG. 23 is a schematic sectional view of a conventional apparatus for the vapor phase growth of a thin copper film.

In the above-described fourteenth embodiment, the spiral tube has a dual tubular structure and the aforesaid inner copper tube is heated by supplying a heating medium to the annular space between the outer tube and inner copper tube of the aforesaid spiral tube. However, the present invention is not limited to the above-described structure. For example, as illustrated in FIG. 21, spiral tube 336 may have a structure consisting of a copper tube 351 and a tubular heater 353 disposed around copper tube 351 with a tubular insulator 352 interposed therebetween. Thus, the aforesaid copper tube 351 can be heated to a predetermined temperature by the aforesaid tubular heater 353.

Although chlorine is used as the raw material gas in the above-described fourteenth embodiment, a copper chloride precursor ($Cu_xCl_y$) can also be produced by using hydrogen chloride.

Although atomic hydrogen is produced by converting hydrogen into a plasma in the above-described fourteenth embodiment, atomic hydrogen may also be produced by installing a heater or other means for heating hydrogen fed into the aforesaid reaction vessel.

What is claimed is:

1. A method for the formation of a metal film which comprises the steps of feeding a raw material gas containing a halogen into an inlet vessel having a perforated plate made of metal; converting the raw material gas into a plasma to generate a raw material gas plasma; etching the perforated plate with the raw material gas plasma to produce a precursor composed of the metallic component contained in the perforated plate and the halogen contained in the raw material gas; converting a reducing gas into a plasma to generate a reducing gas plasma; after discharging the precursor from the inlet vessel, passing the precursor through a rotating magnetic field so as to cause the precursor to travel toward a substrate in an accelerated manner; and passing the precursor through the reducing gas plasma to remove the halogen from the precursor and directing the resulting metallic ion or neutral metal onto the substrate to form a thin metal film on the substrate.

2. A method for the formation of a metal film which comprises the steps of feeding a raw material gas containing a halogen into an inlet vessel having a perforated plate made of metal; converting the raw material gas into a plasma to generate a raw material gas plasma; etching the perforated plate with the raw material gas plasma to produce a precursor composed of the metallic component contained in the perforated plate and the halogen contained in the raw material gas; passing a high-frequency electric current through an electrode having openings that allow the precursor to flow therethrough, and thereby converting a reducing gas into a plasma to generate a reducing gas plasma; and passing the precursor through the reducing gas plasma to remove the halogen from the precursor and directing the resulting metallic ion or neutral metal onto the substrate to form a thin metal film on the substrate.

3. A method for the formation of a metal film which comprises the steps of feeding a raw material gas containing a halogen into an inlet vessel having a perforated plate made of metal; converting the raw material gas into a plasma to generate a raw material gas plasma; etching the perforated plate with the raw material gas plasma to produce a precursor composed of the metallic component contained in the perforated plate and the halogen contained in the raw material gas; producing an atomic reducing gas between the perforated plate and a substrate by heating a reducing gas to a high temperature; and, after discharging the precursor from the inlet vessel, passing the precursor through the atomic reducing gas to remove the halogen from the precursor and directing the resulting metallic ion or neutral metal onto the substrate to form a thin metal film on the substrate.

4. A method for forming a metal film as claimed in any of claims 1 to 3 wherein the perforated plate contains copper and the precursor is $Cu_xCl_y$.

5. An apparatus for the formation of a metal film which comprises an inlet vessel equipped with a metallic perforated plate having discharge orifices bored therethrough and adapted to receive a raw material gas in its internal volume; a first plasma generator for converting the raw material gas received in the inlet vessel into a plasma and thereby generating a raw material gas plasma; a reaction vessel housing the inlet vessel and a substrate; a rotating magnetic field generator for creating a rotating magnetic field between the perforated plate and the substrate; and a second plasma generator for generating a plasma from a reducing gas fed into the reaction vessel.

6. An apparatus for the formation of a metal film which comprises an inlet vessel equipped with a metallic perforated plate having discharge orifices bored therethrough and adapted to receive a raw material gas in its internal volume; a first plasma generator for converting the raw material gas received in the inlet vessel into a plasma and therby generating a raw material gas plasma; a reaction vessel housing the inlet vessel and a substrate; and an electrode for generating a plasma from a reducing gas fed into the reaction vessel by applying high-frequency electric power thereto.

7. An apparatus for the formation of a metal film which comprises an inlet vessel equipped with a metallic perforated plate having discharge orifices bored therethrough and adapted to receive a raw material gas in its internal volume; a plasma generator for converting the raw material gas received in the inlet vessel into a plasma and thereby generating a raw material gas plasma; a reaction vessel housing the inlet vessel and a substrate; and a reducing gas heating device for heating a reducing gas fed into the reaction vessel.

8. An apparatus for the formation of a metal film, the apparatus comprising:

an inlet vessel equipped with a metallic discharge plate having a multitude of discharge orifices bored therethrough and adapted to receive a chlorine-containing raw material gas in its internal volume;

a chamber housing the inlet vessel and a substrate;

first plasma generating means for converting the raw material gas within the inlet vessel into a plasma to generate a raw material gas plasma, and thereby etching the discharge plate with the raw material gas plasma to produce a precursor composed of the metallic component contained in the discharge plate and the chlorine contained in the raw material gas;

second plasma generating means for converting a hydrogen-containing reducing gas within the chamber into a plasma to generate a reducing gas plasma; and chamber heating means for heating the chamber to a predetermined temperature;

whereby the precursor is passed through the reducing gas plasma within the chamber to remove chlorine from the precursor by reduction, without allowing the precursor to deposit on the heated inner wall of the chamber, and the resulting metallic ion is directed onto the substrate to form a metal film on the substrate.

9. An apparatus for the formation of a metal film, the apparatus comprising:

an inlet vessel equipped with a metallic discharge plate having a multitude of discharge orifices bored therethrough and adapted to receive a chlorine-containing raw material gas in its internal volume;

discharge plate heating means for heating the discharge plate to a predetermined temperature;

a chamber housing the inlet vessel and a substrate;

first plasma generating means for converting the raw material gas within the inlet vessel into a plasma to generate a raw material gas plasma, and thereby etching the discharge plate with the raw material gas plasma to produce a precursor composed of the metallic component contained in the discharge plate and the chlorine contained in the raw material gas; and second plasma generating means for converting a hydrogen-containing reducing gas within the chamber into a plasma to generate a reducing gas plasma;

whereby the precursor, which has been produced by etching the heated discharge plate and is hence easy to reduce, is passed through the reducing gas plasma to remove chlorine from the precursor by reduction, and the resulting metallic ion is directed onto the substrate to form a metal film on the substrate.

10. An apparatus for the formation of a metal film, the apparatus comprising:

an inlet vessel equipped with a metallic discharge plate having a multitude of discharge orifices bored therethrough and adapted to receive a chlorine-containing raw material gas in its internal volume;

discharge plate heating means for heating the discharge plate to a predetermined temperature;

a chamber housing the inlet vessel and a substrate;

first plasma generating means for converting the raw material gas within the inlet vessel into a plasma to generate a raw material gas plasma, and thereby etching the discharge plate with the raw material gas plasma to produce a precursor composed of the metallic component contained in the discharge plate and the chlorine contained in the raw material gas;

second plasma generating means for converting a hydrogen-containing reducing gas within the chamber into a plasma to generate a reducing gas plasma; and chamber heating means for heating the chamber to a predetermined temperature;

whereby the precursor, which has been produced by etching the heated discharge plate and is hence easy to reduce, is passed through the reducing gas plasma to remove chlorine from the precursor by reduction, without allowing the precursor to deposit on the heated inner wall of the chamber, and the resulting metallic ion is directed onto the substrate to form a metal film on the substrate.

11. An apparatus for the formation of a metal film, the apparatus comprising:

an inlet vessel equipped with a metallic discharge plate having a multitude of discharge orifices bored therethrough and adapted to receive a chlorine-containing raw material gas in its internal volume;

a chamber housing the inlet vessel and a substrate;

first plasma generating means for converting the raw material gas within the inlet vessel into a plasma to generate a raw material gas plasma, and thereby etching the discharge plate with the raw material gas plasma to produce a precursor composed of the metallic component contained in the discharge plate and the chlorine contained in the raw material gas;

reducing gas heating means for heating a hydrogen-containing reducing gas to a high temperature and thereby producing an atomic reducing gas within the chamber between the substrate and the discharge plate; and chamber heating means for heating the chamber to a predetermined temperature;

whereby the precursor is passed through the atomic reducing gas within the chamber to remove chlorine from the precursor by reduction, without allowing the precursor to deposit on the heated inner wall of the chamber, and the resulting metallic ion is directed onto the substrate to form a metal film on the substrate.

12. An apparatus for the formation of a metal film, the apparatus comprising:

an inlet vessel equipped with a metallic discharge plate having a multitude of discharge orifices bored therethrough and adapted to receive a chlorine-containing raw material gas in its internal volume;

discharge plate heating means for heating the discharge plate to a predetermined temperature;

a chamber housing the inlet vessel and a substrate;

first plasma generating means for converting the raw material gas within the inlet vessel into a plasma to generate a raw material gas plasma, and thereby etching the discharge plate with the raw material gas plasma to produce a precursor composed of the metallic component contained in the discharge plate and the chlorine contained in the raw material gas; and reducing gas heating means for heating a hydrogen-containing reducing gas to a high temperature and thereby producing an atomic reducing gas within the chamber between the substrate and the discharge plate;

whereby the precursor, which has been produced by etching the heated discharge plate and is hence easy to reduce, is passed through the atomic reducing gas to remove chlorine from the precursor by reduction, and the resulting metallic ion is directed onto the substrate to form a metal film on the substrate.

13. An apparatus for the formation of a metal film, the apparatus comprising:

an inlet vessel equipped with a metallic discharge plate having a multitude of discharge orifices bored therethrough and adapted to receive a chlorine-containing raw material gas in its internal volume;

discharge plate heating means for heating the discharge plate to a predetermined temperature;

a chamber housing the inlet vessel and a substrate;

first plasma generating means for converting the raw material gas within the inlet vessel into a plasma to generate a raw material gas plasma, and thereby etching the discharge plate with the raw material gas plasma to produce a precursor composed of the metallic component contained in the discharge plate and the chlorine contained in the raw material gas;

reducing gas heating means for heating a hydrogen-containing reducing gas to a high temperature and thereby producing an atomic reducing gas within the chamber between the substrate and the discharge plate; and chamber heating means for heating the chamber to a predetermined temperature;

whereby the precursor, which has been produced by etching the heated discharge plate and is hence easy to reduce, is passed through the atomic reducing gas within the chamber to remove chlorine from the precursor by reduction, without allowing the precursor to deposit on the heated inner wall of the chamber, and the resulting metallic ion is directed onto the substrate to form a metal film on the substrate.

14. An apparatus for the formation of a metal film as claimed in any one of claims 8 to 13 wherein the discharge plate is made of copper, so that $Cu_xCl_y$ is produced as the precursor.

15. An apparatus for the formation of a metal film as claimed in any one of claims 9, 10, 12 and 13 wherein the discharge plate is made of copper and the predetermined temperature to which the discharge plate is heated by the discharge plate heating means is in the range of 200 to 800° C.

16. An apparatus for the formation of a metal film as claimed in claim 15 wherein the discharge plate heating means comprises means for heating the discharge plate by introducing a rare gas into the inlet vessel, using the first plasma generating means to generate a rare gas plasma, and applying a voltage so as to cause the rare gas component ion to collide with the discharge plate.

17. An apparatus for the formation of a metal film as claimed in any one of claims 9, 10, 12, and 13 wherein the discharge plate heating means for heating the discharge plate by introducing a rare gas into the inlet vessel, using the first plasma generating means to generate a rare gas plasma, and applying a voltage so as to cause the rare gas component ion to collide with the discharge plate.

18. An apparatus for the formation of a metal film, the apparatus comprising:

a reaction vessel in which a substrate to be treated is placed;

an inlet vessel disposed within said reaction vessel and equipped with a copper discharge plate having a plurality of discharge orifices bored therethrough;

temperature control means attached to said copper discharge plate;

a raw material gas feed pipe inserted into said inlet vessel for feeding chlorine or hydrogen chloride;

plasma generating means for generating a plasma of chlorine or hydrogen chloride within said inlet vessel;

atomic reducing gas producing means for producing an atomic reducing gas within said reaction vessel, at least in the neighborhood of said substrate to be treated; and evacuation means for evacuating any gas from said reaction vessel and said inlet vessel.

19. An apparatus for the vapor phase growth of a thin copper film as claimed in claim 18 wherein said temperature control means comprises a circulation pipe built in said copper discharge plate for passing a heating medium or cooling medium therethrough.

20. An apparatus for the formation of a metal film as claimed in claim 18 wherein said atomic reducing gas producing means comprises a reducing gas feed pipe for feeding a reducing gas into said reaction vessel, and a plasma generator for converting the reducing gas into a plasma and thereby producing an atomic reducing gas at least in the neighborhood of said substrate to be treated.

21. An apparatus for the formation of a metal film as claimed in claim 18 wherein said atomic reducing gas producing means comprises a reducing gas feed pipe for feeding a reducing gas into said reaction vessel, and a heating element for heating the reducing gas and thereby producing an atomic reducing gas at least in the neighborhood of said substrate to be treated.

\* \* \* \* \*

UNITED STATES PATENT AND TRADEMARK OFFICE
CERTIFICATE OF CORRECTION

PATENT NO. : 6,656,540 B2
DATED : December 2, 2003
INVENTOR(S) : Hitoshi Sakamoto et al.

It is certified that error appears in the above-identified patent and that said Letters Patent is hereby corrected as shown below:

<u>Title page,</u>
Item [22], PCT Filed Date, should read -- March 26, 2001 --

Signed and Sealed this

Twenty-first Day of June, 2005

JON W. DUDAS
*Director of the United States Patent and Trademark Office*